(12) United States Patent
Masson et al.

(10) Patent No.: US 11,750,226 B2
(45) Date of Patent: Sep. 5, 2023

(54) ERROR CORRECTION CODE SYSTEM WITH AUGMENTED DETECTION FEATURES

(71) Applicant: NVIDIA CORPORATION, Santa Clara, CA (US)

(72) Inventors: Eric Masson, Fremont, CA (US); Nagaraju Balasubramanya, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 83 days.

(21) Appl. No.: 17/343,136

(22) Filed: Jun. 9, 2021

(65) Prior Publication Data
US 2022/0399905 A1    Dec. 15, 2022

(51) Int. Cl.
*H03M 13/29*    (2006.01)
*G06F 11/10*    (2006.01)

(52) U.S. Cl.
CPC ..... *H03M 13/2906* (2013.01); *G06F 11/1076* (2013.01)

(58) Field of Classification Search
CPC .............. H03M 13/2906; G06F 11/1076
See application file for complete search history.

(56) References Cited

U.S. PATENT DOCUMENTS 5,864,440 A * 1/1999 Hashimoto ........ G11B 27/3027
360/49

FOREIGN PATENT DOCUMENTS

KR    20070105025 A * 10/2007 ............ G06F 11/162

OTHER PUBLICATIONS

Machine translation of KR 20070105025 A, Hyun Eu Gin et al., published Oct. 30, 2007, 13 pages, Korean Intellectual Property Office. (Year: 2007).*

* cited by examiner

*Primary Examiner* — Kyle Vallecillo
(74) *Attorney, Agent, or Firm* — Artegis Law Group, LLP

(57) ABSTRACT

Various embodiments include an error correction code (ECC) system that provides protection against various errors in addition to data bit errors. In general, ECC codes protect against data bit errors, where one or more data bits in a data word contain the wrong value. The ECC code is based on the original data bits, such that a data bit error results in a data word that is inconsistent with the ECC code generated for and stored with the data word. The present embodiments generate ECC codes based on address information and/or sequencing information in addition to the data bits in the data word. As a result, the present embodiments detect bit errors in this address information and/or sequencing information. Such errors include write address decoding errors, read address decoding errors, write enable errors, and stale data errors.

20 Claims, 13 Drawing Sheets

ERROR CORRECTION CODE SYSTEM WITH AUGMENTED DETECTION FEATURES

BACKGROUND

Field of the Various Embodiments

Various embodiments relate generally to computer memory systems and, more specifically, to an error correction code system with augmented detection features.

Description of the Related Art

Computer systems generally include, among other things, one or more processors, such as central processing units (CPUs) and/or graphics processing units (CPUs), and one or more memory subsystems. The CPUs and/or GPUs may be integrated with other connection circuitry on a single chip to form a system on chip (SoC). The memory subsystems store instructions that the processors execute in order to perform various tasks. During execution of these instructions, the processors store data in and retrieve data from the memory subsystems. This data includes values that the processors access to perform the tasks, as specified by the instructions.

Embedded memories in SOCs are subject to transient errors and permanent faults. A transient error, referred to herein as a "soft error," is a temporary error that intermittently corrupts one or more data bits stored in the memory cells or intermittently corrupts address decoding and/or related logic that determines which memory cells are written during store operations and read during load operations. In one example, a soft error occurs when an alpha particle strikes a memory cell or a portion of the logic circuits that store data in and load data from the memory cells. A permanent error, referred to herein as a "hard error," is a hardware error that permanently damages a memory cell or address decoding and/or related logic. Typically, hard errors are repaired before the memory device is shipped, or alternatively, the memory device is discarded as defective. Even so, hard errors may occur in a memory system after the hardware is shipped. These soft errors and hard errors may cause corruption in instructions and/or associated data, resulting in unpredictable behavior. Therefore, computer systems often employ mechanisms to mitigate soft errors and hard errors, particularly in applications where safety is of utmost concerns, such as self-driving vehicles and other automotive applications. Further, these types of errors are more likely to occur as the size of memory systems increase.

In order to alleviate such errors, memory systems typically include an error correction code (ECC) system. The ECC system detects and corrects certain types of soft errors that occur within a particular group of memory cells that store data. The ECC system generates an ECC code that is stored when the associated data is written during a data store operation. When the data is subsequently read during a load operation, the ECC code is regenerated and compared with the ECC code store in memory. A discrepancy in the data and/or the ECC code is indicative of an error. Certain ECC systems can detect and correct a single error bit, also referred to herein as a "corrupt bit," and can detect, but not correct, two or more error bits in a codeword. This type of ECC system is referred to as a single error correction double error detection (SECDED) system. More advanced ECC systems may correct and/or detect a 1-bit error, a 2-bit error, a 3-bit error, etc. in the data word, depending on the complexity of the implemented correction and/or detection scheme.

One drawback with traditional ECC systems is that such ECC systems typically are able to only detect an error in only one data word at any given time and are able to detect only data errors. Traditional ECC systems are unable to concurrently detect errors in multiple data words. Further, traditional ECC systems are unable to detect other types of errors, such as address decoder or other logic errors. These types of errors may result in storing correct data at an incorrect address or a failure of a store operation, where no data is stored at all. With these types of errors, the data in memory is consistent with the associated ECC code, and therefore undetectable by the ECC system, even though a memory error has occurred. One solution to this problem is to add additional memory to store additional ECC codes associated with the address bits. An address error is detectible if the address bits for a particular memory location and the ECC code associated with the address bits are inconsistent. However, this solution requires additional memory to store ECC codes, leading to higher cost, more surface area, and higher power consumption.

Another drawback with traditional ECC systems is that memory generally contains random data when a computer system is first powered up. Therefore, the memory storing data and the memory storing ECC codes are generally inconsistent with one another when the computer system is first powered up. As a result, the ECC system generates spurious ECC errors when uninitialized memory is read. One solution to this problem is to initialize memory when the computer system is first powered up, by writing data into each memory location along with consistent ECC codes. However, this initialization process may be time-consuming, particularly for large memory systems, resulting in long bootup times.

As the foregoing illustrates, what is needed in the art are more effective techniques for detecting memory failures in large computing systems.

SUMMARY

Various embodiments of the present disclosure set forth a computer-implemented method for detecting errors in a memory. The method includes retrieving first data associated with a first store operation directed towards a memory address. The method further includes generating a first error correction code (ECC) code based on the first data and at least one of address information and sequencing information associated with the first store operation. The method further includes storing the first data and the first ECC code at the memory address.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, memory errors other than data errors are detectable by the ECC system without needing additional memory to detect such errors. Therefore, address decoder errors and memory write failures are detectable, in addition to data errors, without substantially increasing cost, SoC surface area, or power consumption. Another technical advantage of the disclosed techniques relative to the prior art is that spurious memory errors associated with uninitialized memory are suppressed, alleviating the need to initialize all memory locations when a computer system is first powered up. As a result, bootup times may be reduced relative to prior ECC approaches. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
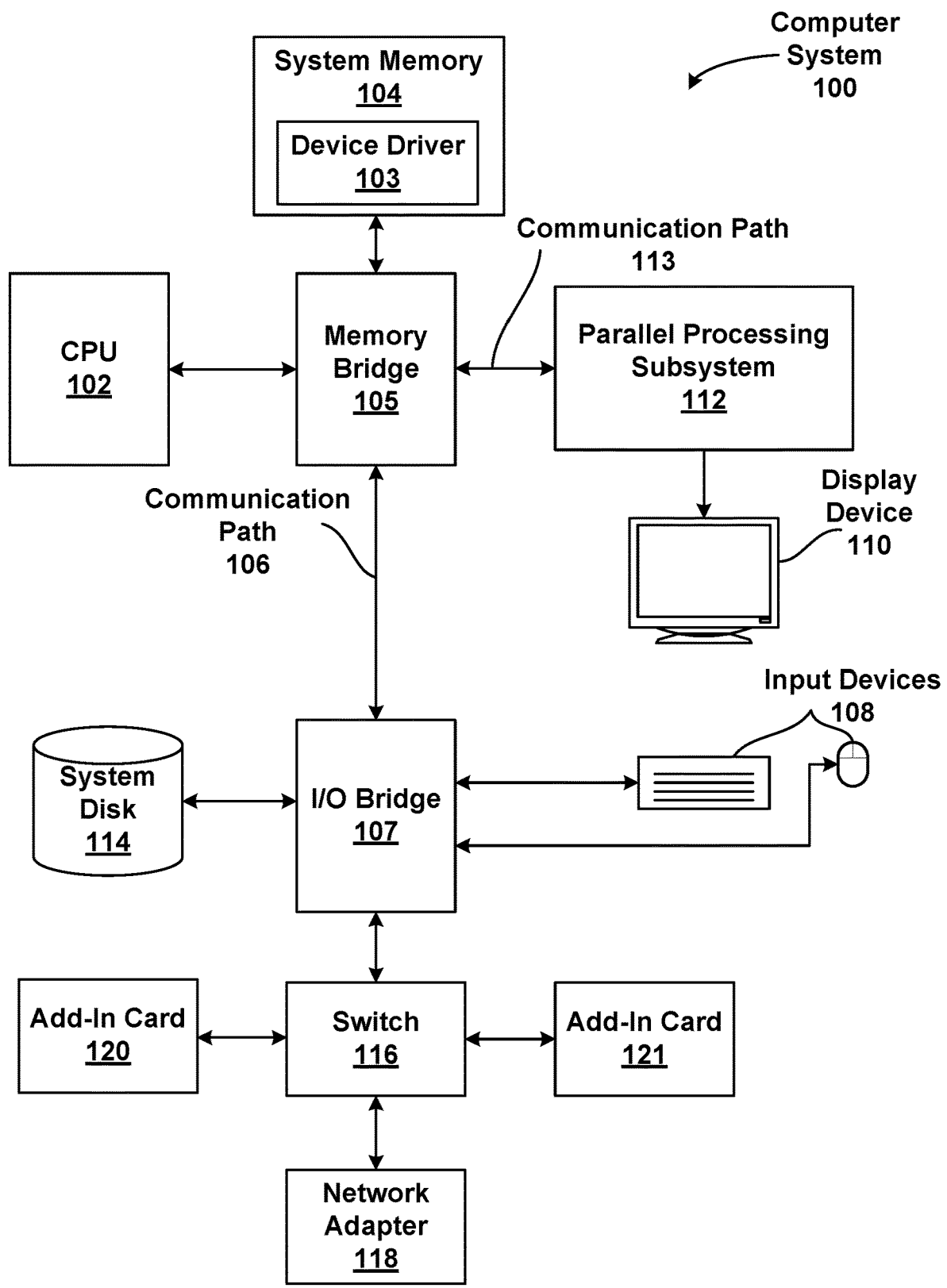
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
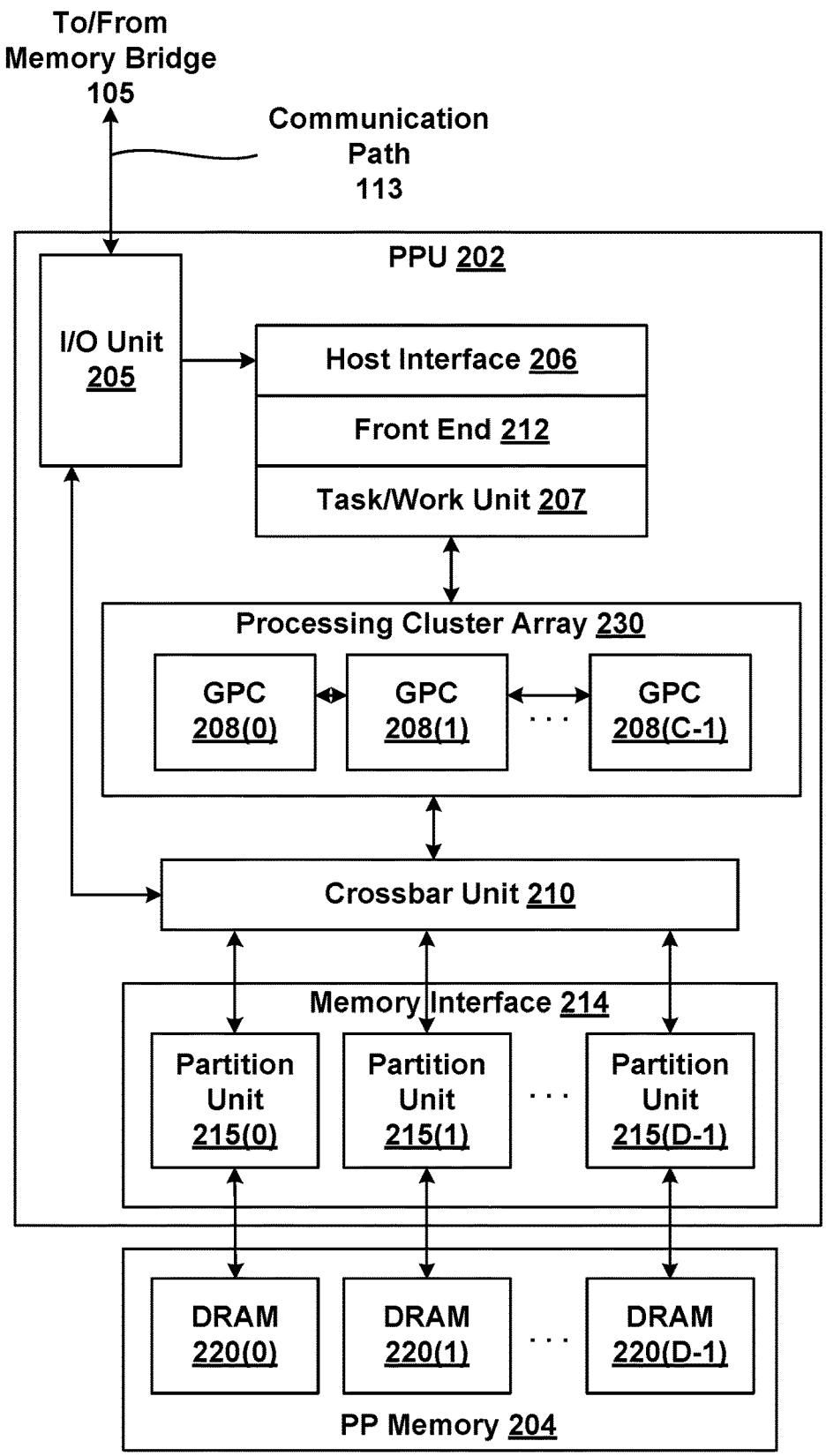
FIG. 2 is a block diagram of a parallel processing unit (PPU) included in the parallel processing subsystem of FIG. 1, according to various embodiments.

FIG. 2 is a block diagram of a parallel processing unit (PPU) 202 included in the parallel processing subsystem 112 of FIG. 1, according to various embodiments. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity, and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Although not shown in FIG. 2, each processor within a GPC 208 includes a level one (L1) cache or uses space in a corresponding L1 cache outside of the processor to support, among other things, load and store operations performed by the execution units. Each processor within a GPC 208 also has access to level two (L2) caches (not shown) that are shared among all GPCs 208 in PPU 202. The L2 caches may be used to transfer data between threads. Finally, the processors within a GPC 208 also have access to off-chip "global" memory, which may include PP memory 204 and/or system memory 104. It is to be understood that any memory external to PPU 202 may be used as global memory. Additionally, a level one-point-five (L1.5) cache (not shown) may be included within GPC 208 and configured to receive and hold data requested from memory via memory interface 214 by a processor within a GPC 208. Such data may include, without limitation, instructions, uniform data, and constant data. In embodiments having multiple processors within a GPC 208, the processors may beneficially share common instructions and data cached in the L1.5 cache.

It will be appreciated that the core architecture described herein is illustrative and that variations and modifications are possible. Among other things, any number of processing units may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-2 in no way limits the scope of the various embodiments of the present disclosure.

Please note, as used herein, references to shared memory may include any one or more technically feasible memories, including, without limitation, a local memory shared by one or more processors within a GPC 208, or a memory accessible via the memory interface 214, such as a cache memory, parallel processing memory 204, or system memory 104. Please also note, as used herein, references to cache memory may include any one or more technically feasible memories, including, without limitation, an L1 cache, an L1.5 cache, and L2 caches.

Error Correction Code System with Augmented Detection Features

An error correction code (ECC) system is disclosed that is capable of detecting various system errors in addition to data bit errors. More specifically, the ECC system detects write address decoding errors, read address decoding errors, write enable errors, stale data errors, and/or the like. Write address decoding errors result in data being written to an incorrect memory address during store operations. Similarly, read address decoding errors result in data being read from an incorrect memory address during load operations. Write enable failures result in one or more devices failing to write data during store operations or to read data during load operations. Stale data errors occur when a successfully written memory location is subject to a subsequent write that completely fails. This condition leaves the memory address with the data from the first write. In some embodiments, the disclosed ECC system may detect one error of any type at a given time. In some embodiments, the disclosed ECC system may detect certain combinations of multiple such errors. Traditional ECC systems are incapable of detecting these additional types of errors unless the ECC codes are stored in separate memory, and the separate write to that separate memory does not fail.

The additional errors are detected by relying on two properties. First, The ECC system disclosed herein generates ECC codes from address and sequencing information as well as from the data bits. In addition to data bits, the input to the ECC system is augmented to include read address, write address, and write enable masks (in the case of a line buffer memory) or write pointer and read pointer (in the case of a first-in-first-out (FIFO) memory). The input to the ECC system is further augmented to include sequencing information such as line numbers, cycling pixel tile count, and frame count (in the case of a line buffer memory) or a sequence number (in the case of a FIFO memory). More specifically, in a FIFO memory, the write pointer and read pointer that specify addresses within the FIFO memory are augmented with one or more bits that indicate a cycle count.

Second, certain memories, such as line buffer memories and FIFO memories, have regular, predictable write access patterns and read access patterns. In such memories, the address and sequencing information generated during store operations may be regenerated during load operations. Therefore, the address and sequencing information does not need to be stored in memory, even though the address and sequencing information is used to generate the ECC code. Instead, only the data bits and the ECC code are stored in memory. The disclosed techniques may be applied to any memory system with a regular or predictable access pattern, such as line buffer memories, FIFO memories, read-modify-write memory systems, and/or the like.

Further, certain memories, such as line buffer memories, have one store circuit but multiple load circuits. This feature allows for concurrently reading multiple memory lines, such as 20 memory lines, during load operations. The disclosed ECC system includes one ECC generation circuit that services multiple memory lines and separate ECC termination circuits for each memory line. As a result, the ECC system is able to correct and/or detect multiple errors per memory load operation—one error per memory line stored in the line buffer memory. Because only one ECC generation circuit on the store side of the line buffer memory is needed to support multiple ECC termination circuits on the load side of the line buffer memory, the hardware cost in terms of die area and power consumption is approximately one-half the traditional approach that includes one ECC generation circuit and one ECC termination circuit for each memory line in the line buffer memory.

In addition, the ECC system generates a valid indicator based on tracking word masks. ECC errors are enabled for memory lines that are determined to be valid and disabled for memory lines that are determined to be invalid. Therefore, the ECC system eliminates the need for an initialization pass at the time of bootup or system power up. Should portions of uninitialized memory be read, any spurious error due to uninitialized memory is filtered by tracking word masks.

Figure 3:
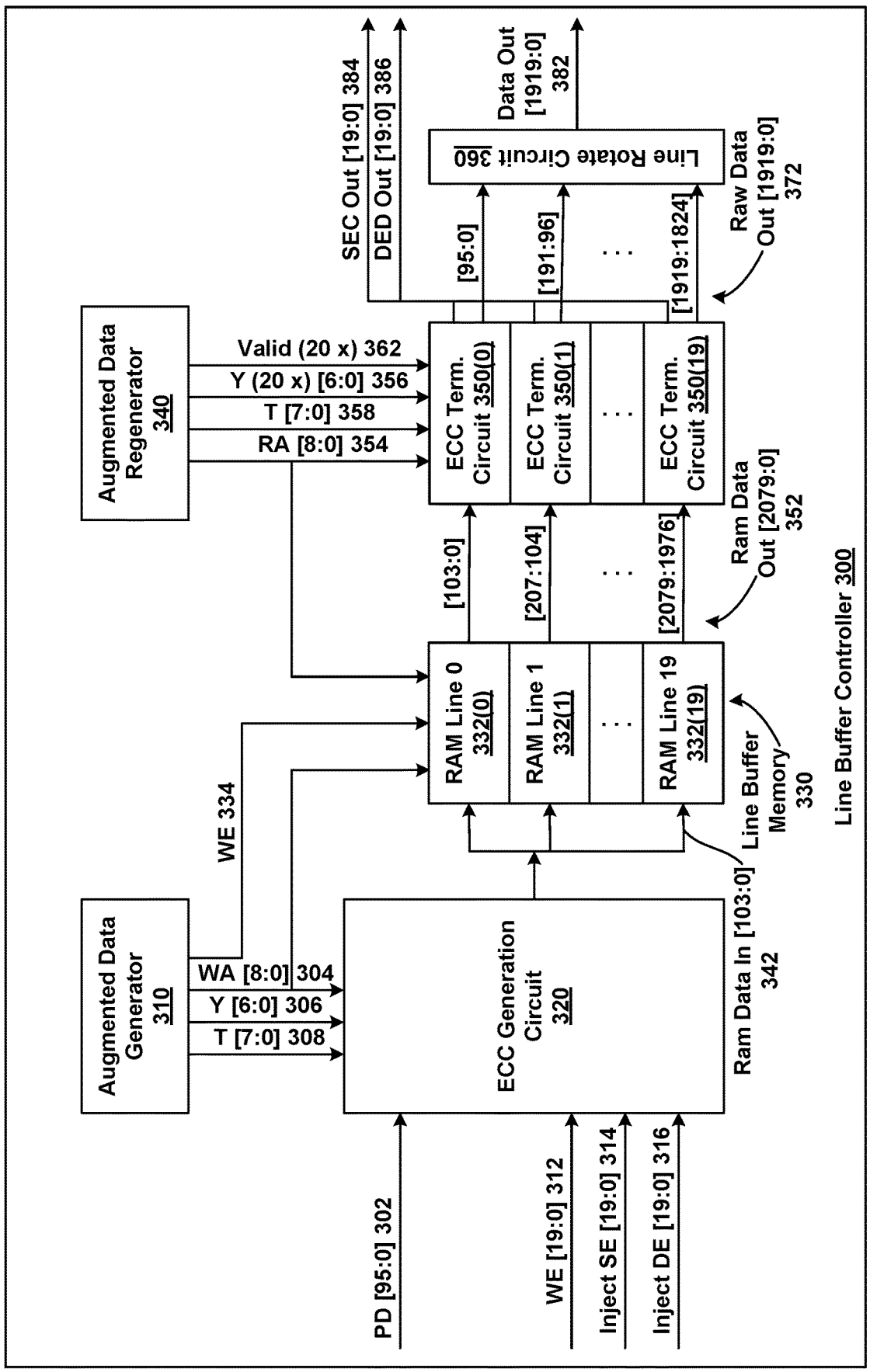
FIG. 3 is a block diagram of an error correction code (ECC) system associated with the computer system of FIG. 1, according to various embodiments.

FIG. 3 is a block diagram of an error correction code (ECC) system 300 associated with the computer system 100 of FIG. 1, according to various embodiments. The ECC system 300 is also referred to herein as a line buffer controller. As shown, the ECC system 300 includes, without limitation, an augmented data generator 310, an ECC generation circuit 320, a line buffer memory 330, an augmented data regenerator 340, ECC termination circuits 350, and a line rotate circuit 360.

In operation, the augmented data generator 310 generates augmented data for store operations, including address information and sequencing information. As shown, the augmented data generator 310 generates a tile number T[7:0] 308, a Y-coordinate Y[6:0] 306, a write address WA[8:0] 304, and a write enable 334. In some embodiments, the write enable 334 may be a 20-bit field, where a different bit of the write enable 334 is transmitted to each of the different in the line buffer memory 330. In such embodiments, the 20-bit write enable 334 20-bit field may be a duplicate of the WE[19:0] bits 312 transmitted to the error injection port, described herein. The tile number T[7:0] 308 is an 8-bit rolling counter that cycles every 256 tiles. In image processing, an image is typically divided into rectangular tiles that are laid out in a horizontal and vertical grid. The tile number identifies which tile in the image is currently being processed. The Y-coordinate [6:0] 306 includes the 7 least significant bits of the Y-coordinate within the image that is being written in the line buffer memory 330. Additionally or alternatively, the Y-coordinate [6:0] 306 includes the 7 least significant bits of the Y-coordinate within the tile. The write address WA[8:0] 304 includes the 9 least significant bits of the address that is being written in the line buffer memory 330. Because the X-coordinate within the tile generally increments in the same steps as the write address, the least significant bits of the write address WA[8:0] 304 represents the X-coordinate within the tile that is being written in the line buffer memory 330. The write enable WE 334 enables the write to the appropriate memory address in the line buffer memory 330. The augmented data generator 310 transmits the tile number T[7:0] 308, the Y-coordinate Y[6:0] 306, and the write address WA[8:0] 304 to the ECC generation circuit 320. In addition, the augmented data generator 310 transmits the write address WA[8:0] 304 and the write enable 334 to the line buffer memory 330.

In operation, the ECC generation circuit 320 generates an ECC code from a 96-bit word of pixel data PD[95:0] 302 as well as the tile number T[7:0] 308, the Y-coordinate Y[6:0] 306, and the write address WA[8:0] 304 received from the augmented data generator 310. The 96-bit data word represents two pixels of 48 bits per pixel. In general, a pixel is represented by three components of 16 bits per component. In some embodiments, the three components may include Y, U, and V components, where Y is a 16-bit luminance value and U and V are 16-bit color difference components. In some embodiments, the three components may include R, G, and B components, where R, G, and B are red, green, and blue color components, respectively. In some embodiments, the number of bits in each data word, the number of components in each data word, and the number of bits in each component of a data word may be any technically feasible amount. Further, the data stored within each data word may be pixel data in any technically feasible format and/or non-pixel data in any technically feasible combination.

The number of error bits needed to generate a SECDEC ECC code is $X=\log_2(\text{number of protected bits})+1$, rounded up to the next higher integer. As shown, the number of protected bits is 96 data bits, 8 tile number bits, 7 Y-address bits, and 9 write address bits for a total of 96+8+7+9=120 protected bits. Therefore, the ECC code is $X=\log_2(120)+1=8$ bits after rounding up. By including the 8 tile number bits, 7 Y-address bits, and 9 write address bits when generating the ECC code, the ECC code protects against errors in those additional fields. Errors in the tile number, Y-address, and/or write address may result in address decoding faults, write enable mask faults, stale data errors, and/or the like. The ECC generation circuit 320 protects against these types of errors in addition to data bit errors. In various embodiments, the ECC code may include any technically feasible number of bits, depending on the number of detectible error bits, the number of correctable error bits, and the encoding scheme for the ECC codes.

As a point of comparison, if only the 96-bit data word is protected, the ECC code would be $X=\log_2(96)+1=8$ bits after rounding up. As a result, protecting errors in the additional tile number bits, Y-address bits, and write address bits does not result in additional bits in the ECC code. Therefore, no additional memory is needed to protect the additional tile number bits, Y-address bits, and write address bits. More generally, the number of ECC bits in the ECC code increments by one when the rounded up result of $X=\log_2(\text{number of protected bits})+1$ increases by one to the next integer. The condition is referred to crossing a binade, where a binade is a range of a given power of 2. For example, the binade from 64 to 127 represents 7 bits (corresponding to an 8-bit ECC code). The next binade from 128 to 255 represents 8 bits (corresponding to a 9-bit ECC code). The next binade from 256 to 511 represents 9 bits (corresponding to a 10-bit ECC code), and so on. With this approach, if adding the augmented data fields to the data bits does not cross a binade, no additional bits are needed in the ECC code.

Additionally or alternatively, the ECC generation circuit 320 may generate ECC codes via any technically feasible techniques. In some embodiments, the ECC generation circuit 320 may employ Reed-Solomon codes to generate the ECC codes. In such embodiments, the number of bits in the ECC codes for a given number of protected bits may differ from the number of bits using the approach described above. Even so, any reasonable approach to generate ECC codes results in no or a small number of additional ECC code bits in order to protect the augmented data in addition to the input data.

The ECC generation circuit 320 includes an error injection port for testing purposes. The error injection is selected on a per line basis, each line having a separate injection control for both single and double error injection. The WE[19:0] bits 312 select a memory line in the line buffer memory 330 to receive the injected error. When a WE[19:0] bit 312 is asserted, the corresponding inject SE[19:0] input 314 causes the ECC generation circuit 320 to inject a single-bit error into the selected memory line. Similarly, when a WE[19:0] bit 312 is asserted, the corresponding inject DE[19:0] input 316 causes the ECC generation circuit 320 to inject a double-bit error into the selected memory line. If, for the currently asserted bit in the WE[19:0] bits 312, the corresponding inject SE[19:0] input 314 does not present an error, then no single bit error is injected into the selected memory line. Similarly, if, for the currently asserted bit in the WE[19:0] bits 312, the corresponding inject DE[19:0] input 316 does not present an error, then no double bit error is injected into the selected memory line.

Upon generating the ECC code, the ECC generation circuit 320 transmits only the 96-bit data word and the 8-bit ECC code to the line buffer memory 330 as RAM data in [103:0] 342. The additional 24 bits for tile number, Y-address, and write address are removed and not stored to the line buffer memory 330.

In operation, the line buffer memory 330 stores pixel data and ECC codes received from the ECC generation circuit 320. Each write to the line buffer memory 330 stores 96 bits of pixel data (two pixels) and 8 bits of ECC code as RAM data in [103:0] 342. The ECC code protects against errors in the data bits as well as against errors in the additional fields that the ECC code is generated from, including the tile address bits, the Y-coordinate bits, and the write address bits. During store operations, the line buffer memory 330 stores the 96 bits of pixel data and 8 bits of ECC code in one of the 20 memory lines 332(0), 332(1), . . . 332(19), also referred to herein as RAM lines 332. The line buffer memory 330 stores the pixel data and ECC code in the particular memory line 332 specified by the write address WA[8:0] 304 and the write enable 334. During load operations, the line buffer memory 330 transmits the 96 bits of pixel data and 8 bits of ECC code in all 20 memory lines 332(0), 332(1), . . . 332(19). The line buffer memory 330 loads the pixel data and ECC code from the particular memory line 332 as specified by the read address RA[8:0] 354. The line buffer memory 330 presents 104 bits for each of the 20 memory lines 332 for a total of 2080 bits as RAM data out [2079:0] 352.

In operation, the augmented data regenerator 340 regenerates augmented data for load operations, including address information and sequencing information. As shown, the augmented data regenerator 340 generates a tile number T[7:0] 358, 20 Y-coordinates Y[6:0] 356 for the 20 memory lines 332, and a read address RA[8:0] 304. Because the read access pattern of the line buffer memory 330 is identical to the write access pattern of the line buffer memory 330, the augmented data regenerator 340 regenerates the same augmented data in the same order as generated by the augmented data generator 310 during store operations.

In addition, the augmented data regenerator 340 generates 20 valid bits 362 for the 20 memory lines 332. During certain image processing operations, data is read from multiple memory lines 332 that represent pixels from image lines that are above the current pixel and image lines that are below the current pixel, as well as pixels from the same image line as the current pixel. For example, when processing a 21×21 pixel area, data is read from 10 image lines above the current pixel and 10 image lines below the pixel, as well as data from the image line that includes the current pixel. As shown, pixel data and ECC codes are read from all 20 memory lines 332 concurrently and transmitted to respective ECC termination circuits 350.

However, when processing pixels at the top of the image, there may be fewer than 10 image lines above the current pixel. Similarly, when processing pixels at the bottom of the image, there may be less than 10 image lines below the current pixel. For example, if the current pixel is on line 0, the first line of the image, then the ten lines above the current pixel are invalid while the ten lines below the current pixel are valid. If the current pixel is on line 5, the sixth line of the image, then the five lines above the current pixel, lines 0 through 4, are valid, but the five lines above line 0 are invalid. Similarly, if the current pixel is on the last line of the image, then the ten lines below the current pixel are invalid while the ten lines above the current pixel are valid. If the current pixel is on the sixth line from the bottom of the image, then the five lines below the current pixel are valid, but the five lines below the last line of the image are invalid.

Therefore, the augmented data regenerator 340 generates valid bits 362 for each of the 20 memory lines 332. If the valid bit is set for a particular memory line 332, then the data stored in that memory line 332 includes image data from an actual image line. If the valid bit is not set for a particular memory line 332, then the data stored in that memory line 332 may be random or stale, because the memory line 332 is either above the first line of the image or below the last line of the image. By generating valid bits, the augmented data regenerator 340 eliminates the need for an initialization pass to store valid pixel data and ECC codes in the line buffer memory 330 at bootup or power up time.

The augmented data regenerator 340 transmits the tile number T[7:0] 358, the Y-coordinates 20×Y[6:0] 356, the read address RA[8:0] 354, and the 20 valid bits 362 to the ECC termination circuits 350. In addition, the augmented data regenerator 340 transmits the read address RA[8:0] 354 to the line buffer memory 330.

In operation, each of the ECC termination circuits 350(0), 350(1), . . . 350(19) verifies the ECC code for the corresponding memory line 332(0), 332(1), . . . 332(19). The ECC termination circuit 350 generates an ECC code from a 96-bit word of pixel data received from the respective memory line 332 as well as the tile number T[7:0] 358, the Y-coordinate Y[6:0] 356, and the read address RA[8:0] 354 received from the augmented data regenerator 340. The 96-bit data word represents two pixels of 48 bits per pixel. The ECC termination circuit 350 compares the generated ECC code with the ECC code received from the respective memory line 332. If the generated ECC code is equal to the ECC code received from the respective memory line 332, then the ECC termination circuit 350 indicates that no memory error has occurred. If the generated ECC code is not equal to the ECC code received from the respective memory line 332, then the ECC termination circuit 350 indicates that a memory error has occurred.

If the memory error is a data bit error, then the ECC termination circuit 350 detects and/or corrects the error according to the capability of the ECC termination circuit 350 to detect and correct 1-bit errors, 2-bit errors, 3-bit errors, and/or the like. If the memory error is an error in the augmented addressing and sequencing information, then the error may be more serious, such as writing a data word to an incorrect memory address or failing to write data to memory. Therefore, if the memory error is an error in the augmented addressing and sequencing information, then the ECC termination circuit 350 forces a double bit error or otherwise indicates that the detected error is not correctable. If the ECC termination circuit 350 detects and corrects a single bit error, then the ECC termination circuit 350 transmits an indicator on a corresponding bit of the single bit error correction field SEC out [19:0] 384. If the ECC termination circuit 350 detects a double bit error, or otherwise forces a double bit error, then the ECC termination circuit 350 transmits an indicator on a corresponding bit of the double bit error detection field DED out [19:0] 386.

The ECC termination circuit 350 also receives a valid bit 362 from the augmented data regenerator 340. If the valid bit 362 is set, then the ECC termination circuit 350 verifies the ECC code, as described herein. If the valid bit 362 is not set, then the pixel data and/or ECC code received memory line 332 has not been initialized or is otherwise invalid. In such cases, the ECC termination circuit 350 does not detect and/or correct any memory errors during the corresponding load operation. After verifying the ECC code, or ignoring the ECC code if the valid bit is not set, the ECC termination circuit 350 transmits the 96-bit pixel data word to the line rotate circuit 360. Taken together, the ECC termination circuits 350 transmit 20×96-bits=1920 bits of pixel data as raw data out [1919:0] 372 to the line rotate circuit 360.

In operation, the line rotate circuit 360 performs a barrel shift on the pixel data received as raw data out [1919:0] from the ECC termination circuits 350. In certain image processing operations, the current pixel is advantageously in a certain position in a pixel array, while other pixels, such as pixels from image lines above and/or below the current pixel, are in certain other positions. However, the pixel data received from the various ECC termination circuits 350 may not present the current pixel in the proper position. Therefore, the line rotate circuit 360 rotates the raw data out [1919:0] received from the ECC termination circuits 350 to place the current pixel in the proper position. After rotating the raw data out [1919:0], the line rotate circuit 360 transmits the data out [1919:0] 382 with the current pixel in the proper position.

Figure 4:
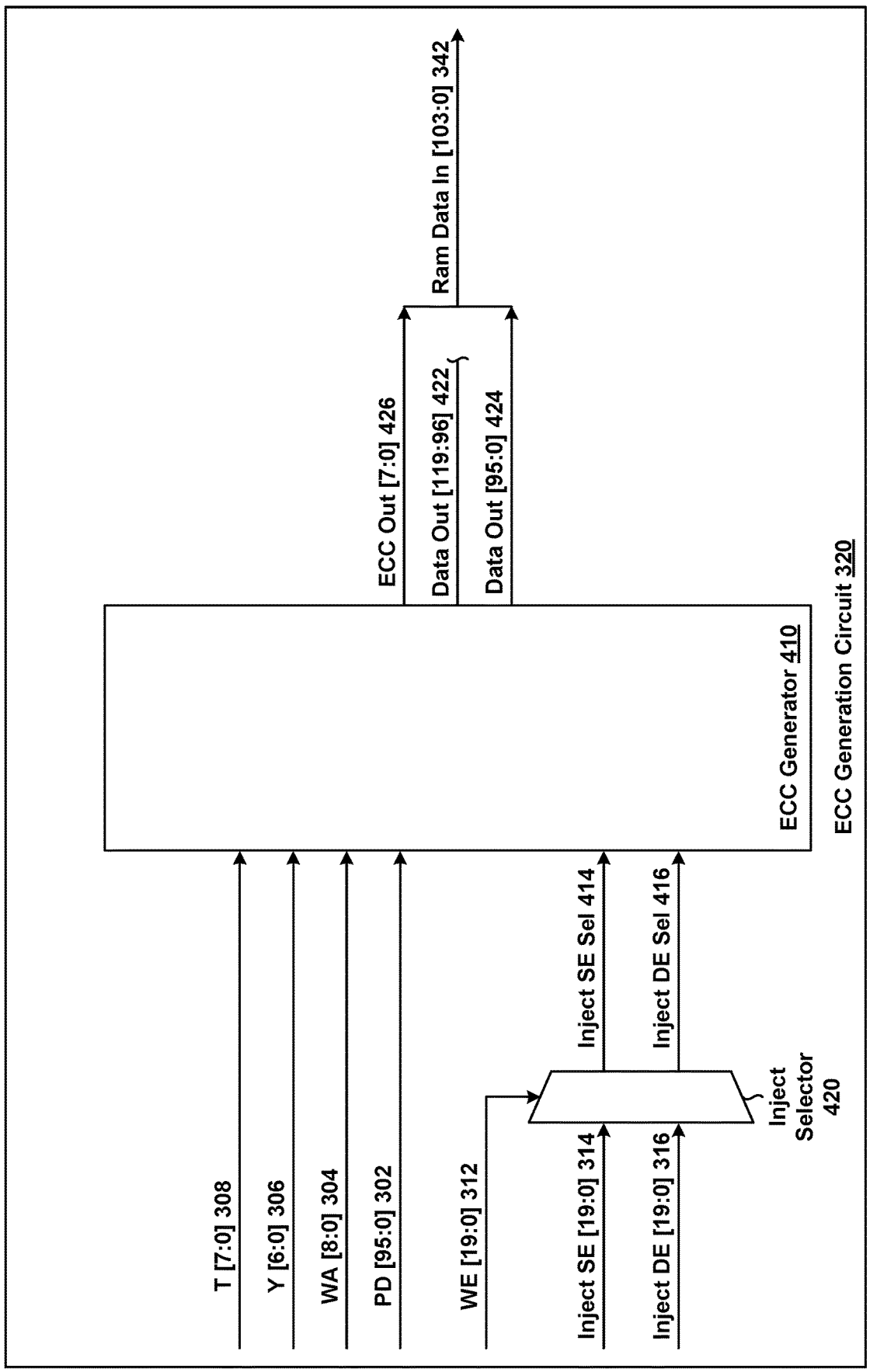
FIG. 4 is a block diagram of the ECC generation circuit included in the ECC system of FIG. 3, according to various embodiments.

FIG. 4 is a block diagram of the ECC generation circuit 320 included in the ECC system 300 of FIG. 3, according to various embodiments. As shown, the ECC generation circuit 320 includes, without limitation, an ECC generator 410 and an inject selector 420. As described herein, the ECC generation circuit 320 receives pixel data PD[95:0] 302 representing three 16-bit pixel components for each of two pixels in an image. In addition, the ECC generation circuit 320 receives a tile number T[7:0] 308, a Y-coordinate Y[6:0] 306, and a write address WA[8:0] 304 from the augmented data generator 310. The ECC generation circuit 320 generates an ECC code based on the pixel data PD[95:0] 302 as well as the tile number T[7:0] 308, the Y-coordinate Y[6:0] 306, and the write address WA[8:0] 304. The ECC generation circuit 320 transmits the ECC code as ECC out [7:0] 426. The ECC generation circuit 320 also transmits the received pixel data and additional data as data out [119:96] 422 and data out [95:0] 424.

The ECC generation circuit 320 is able to inject errors for testing purposes into particular memory lines 332 of the line buffer memory 330 via the inject selector 420. During normal operation, the write enables [19:0] 312 are inactive, and the ECC generation circuit 320 generates ECC codes as described herein. To inject an error on one of the 20 memory lines 332, the respective write enable [19:0] 312 is asserted and an error input is presented on either the corresponding inject SE[19:0] input 314 or the inject DE[19:0] input 316. To inject a single bit error, the inject selector selects the corresponding inject SE[19:0] input 314 and transmits the inject SE[19:0] input 314 to the ECC generator 410 as inject SE sel 414. When the ECC generator 410 generates the ECC code for the selected memory line 332, the ECC generator 410 purposely generates an ECC code that is indicative of a single bit error. Similarly, to inject a double bit error, the inject selector selects the corresponding inject DE[19:0] input 316 and transmits the inject DE[19:0] input 314 to the ECC generator 410 as inject DE sel 416. When the ECC generator 410 generates the ECC code for the selected memory line 332, the ECC generator 410 purposely generates an ECC code that is indicative of a double bit error.

After generating the ECC code, and optionally injecting a single bit error or a double bit error in the ECC code, the ECC generation circuit 320 transmits data out [95:0] 424, representing the pixel data, to the line buffer memory 330. The ECC generation circuit 320 discards data out [119:96] 422, representing the tile number T[7:0] 308, the Y-coordinate Y[6:0] 306, and the write address WA[8:0] 304. The ECC generation circuit 320 combines ECC out [7:0] and data out [95:0] 424 and transmits the combined data as RAM data in [103:0] to the line buffer memory 330.

Figure 5:
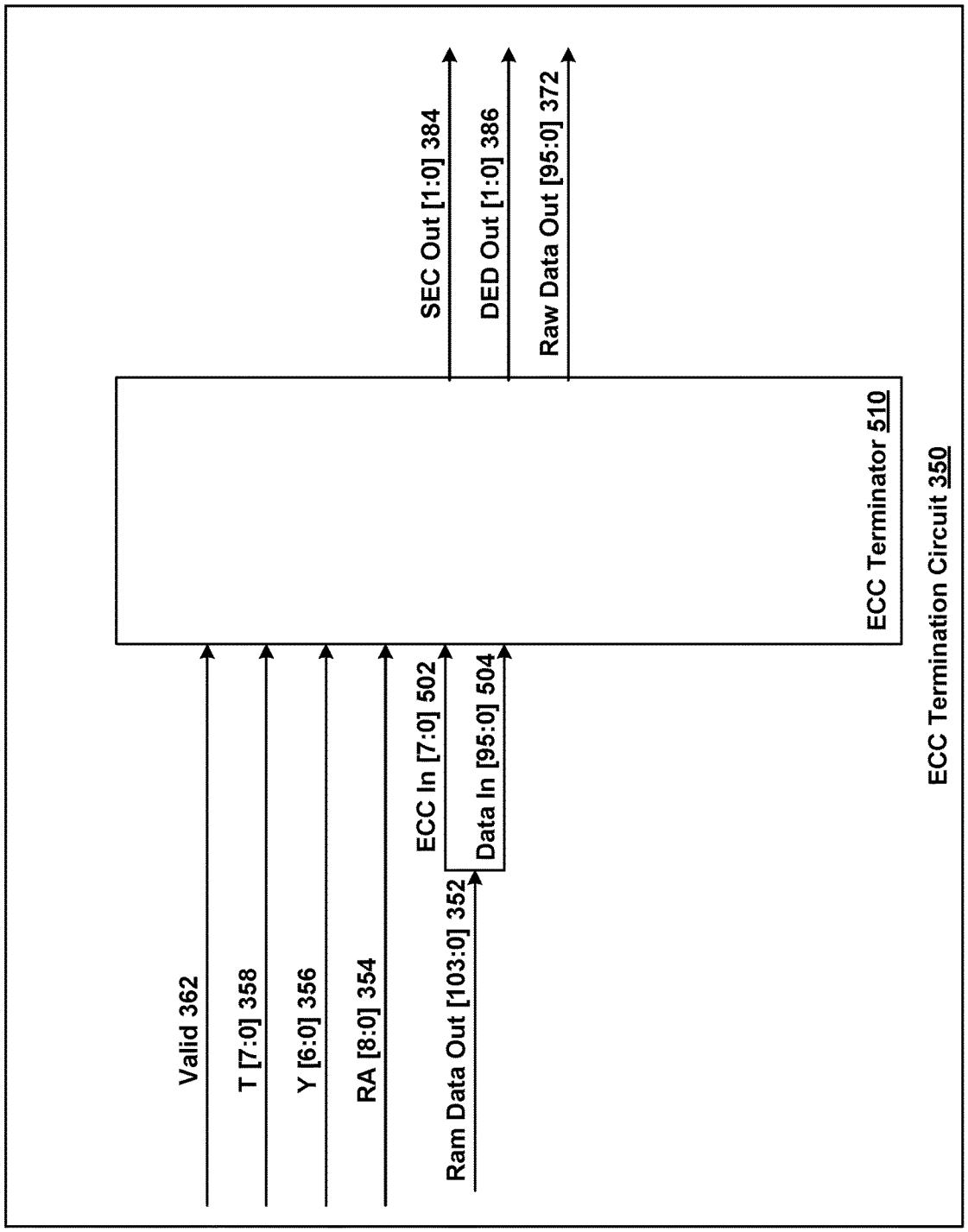
FIG. 5 is a block diagram of one of the ECC termination circuit included in the ECC system of FIG. 3, according to various embodiments.

FIG. 5 is a block diagram of one of the ECC termination circuit 350 included in the ECC system 300 of FIG. 3, according to various embodiments. As shown, the ECC termination circuit 350 includes, without limitation, an ECC terminator 510. The ECC termination circuit 350 receives RAM data out [103:0] from the corresponding memory line 332. The ECC termination circuit 350 separates the RAM data out [103:0] into two fields. The first field is ECC in [7:0] 502, representing the ECC code stored in the corresponding memory line 332. The second field is data in [95:0] 504, representing the pixel data stored in the corresponding memory line 332. In addition, the ECC termination circuit 350 receives the tile number T[7:0] 358, the respective Y-coordinate Y[6:0] 356 for the corresponding memory line 332, the read address RA[8:0] 354, and the respective valid bit 362 from the augmented data regenerator 340 transmits. The ECC termination circuit 350 generates an ECC code from data in [95:0] 504 received from the respective memory line 332 as well as the tile number T[7:0] 358, the Y-coordinate Y[6:0] 356, and the read address RA[8:0] 354 received from the augmented data regenerator 340. The ECC termination circuit 350 compares the generated ECC code with the ECC code received from the respective memory line 332. If the generated ECC code is equal to the ECC code received from the respective memory line 332, then the ECC termination circuit 350 indicates that no memory error has occurred. If the generated ECC code is not equal to the ECC code received from the respective memory line 332, then the ECC termination circuit 350 indicates that a memory error has occurred. If the ECC termination circuit 350 detects and corrects a single bit error, then the ECC termination circuit 350 transmits an indication on SEC out [1:0] 384. If the ECC termination circuit 350 detects a double bit error, then the ECC termination circuit 350 transmits an indication on DED out [1:0] 386. Further, as described herein, if a memory error is an error in the augmented addressing and sequencing information, then the error may be more serious, such as writing a data word to an incorrect memory address or failing to write data to memory. Therefore, if the memory error is an error in the augmented addressing and sequencing information, then the ECC termination circuit 350 forces a double bit error or otherwise indicates that the detected error is not correctable.

The ECC termination circuit 350 also receives a valid bit 362 from the augmented data regenerator 340. If the valid bit 362 is set, then the ECC termination circuit 350 verifies the ECC code, as described herein. If the valid bit 362 is not set, then the pixel data and/or ECC code received memory line 332 has not been initialized or is otherwise invalid. In such cases, the ECC termination circuit 350 does not detect and/or correct any memory errors during the corresponding load operation. After verifying the ECC code, or ignoring the ECC code if the valid bit is not set, the ECC termination circuit 350 transmits the 96-bit pixel data word to the line rotate circuit 360. The ECC termination circuit 350 transmits the data, including corrections to the data, as raw data out [95:0] 372 to the line rotate circuit 360.

Figure 6:
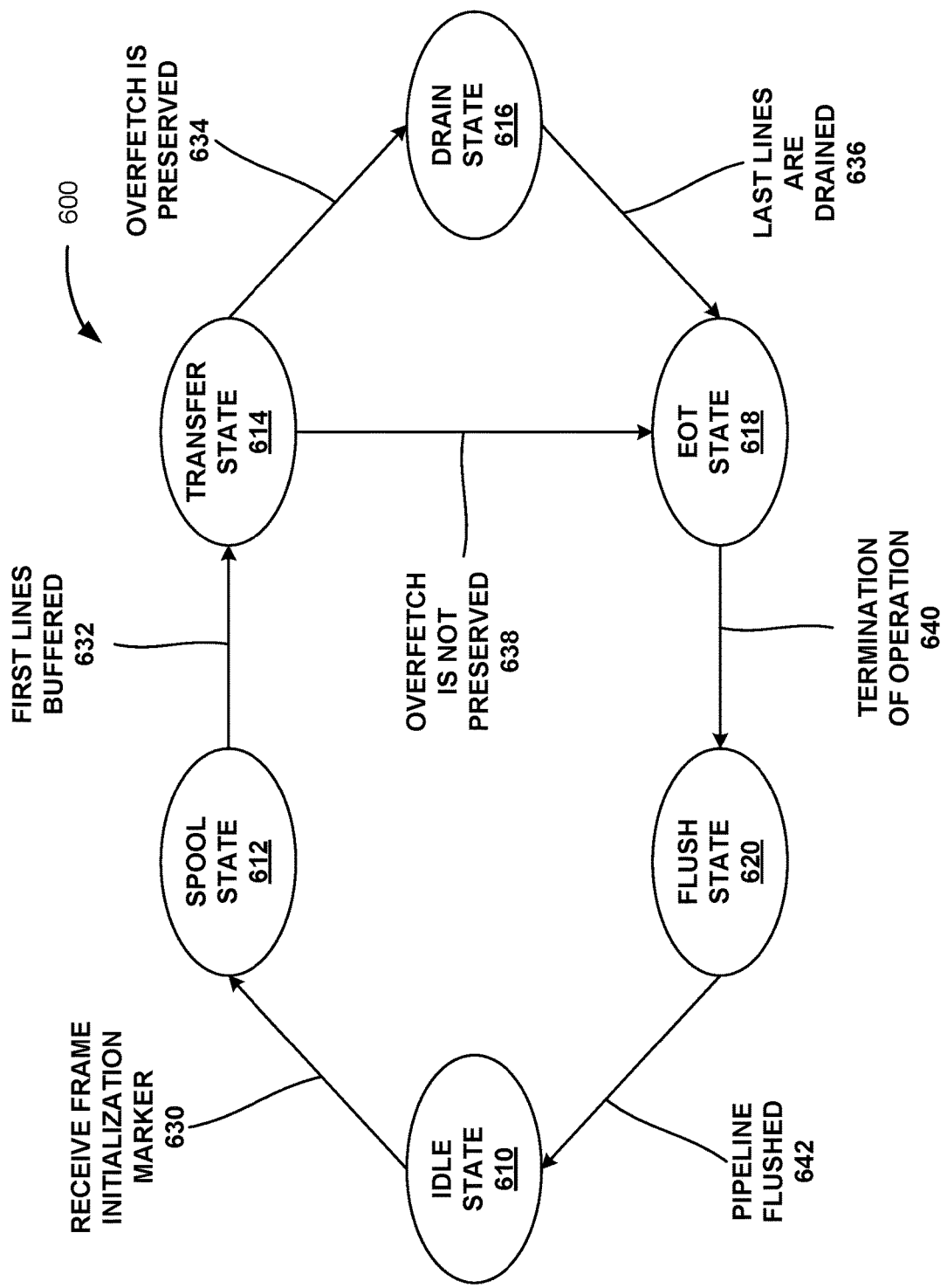
FIG. 6 is a state diagram for the line buffer memory of the ECC system of FIG. 3, according to various embodiments.

It will be appreciated that the system shown herein is illustrative and that variations and modifications are possible. As shown in FIGS. 4-6, the ECC system 300 generates and verifies ECC codes based on 96 data bits, 8 tile number bits, 7 Y-coordinate bits, and 9 write/read address bits. However, the ECC system 300 may generate and verify ECC codes based on fewer bits or more bits for any one of more of these fields, within the scope of the present disclosure. Further, the ECC system 300 may generate and verify ECC codes based on fewer fields or more fields than the fields shown in FIGS. 4-6. Additional fields may include the write enables 334, a field number, and/or the like. In one example, the ECC system 300 could include a frame number that sequences over a number of image frames. For example, a two-bit frame number would count over a sequence of four frames. Within a given image frame, each pixel has a unique tile number, Y-coordinate, and write/read address (i.e., X-coordinate). Adding a frame number to the ECC system 300 additionally provides temporal protection over a number of image frames, such as a failure to store a pixel in a particular frame. Such a failure may be detected during a load operation for a subsequent frame where stale pixel data is loaded from a prior image frame. In another example, the ECC system 300 could include a stream number that identifies a source of the data stored in the line buffer memory 330 of the ECC system 300. If, for example, the ECC system 300 receives data from up to eight cameras, then a stream number that includes at least three bits could identify the camera that transmitted a particular set of data to the ECC system 300. If the ECC system 300 receives data from the eight cameras in a particular pattern, such as a round robin pattern that cycles through the eight cameras, then the stream number does not need to be store in the line buffer memory 330. Instead, the stream number may be reproduced by the augmented data regenerator 340 in the manner described herein.

As shown in FIGS. 4-6, a line buffer memory includes one ECC generation circuit 320 and 20 ECC termination circuits 350 to support 20 memory lines 332 in the line buffer memory 330. Accordingly, the ECC system 300 concurrently detects and/or corrects one ECC error for each of the 20 memory lines 332, or up to 20 ECC errors concurrently. Alternatively, the ECC system 300 may include any technically feasible number of ECC generation circuits 320, ECC termination circuits 350, and/or memory lines 332, within the scope of the present disclosure.

The techniques disclosed herein are within the context of a line buffer memory 330, such as is deployed for image processing and similar applications. However, the disclosed techniques may be deployed in any memory system that has a regular, predictable write access pattern and read access pattern, such as a first-in-first-out (FIFO) memory, read-modify-write memory systems, and/or the like. In a particular example, a FIFO memory is essentially a circular buffer that cycles through a memory. Initially, when the FIFO memory is empty, a write pointer is set to zero. As data is stored in the memory addresses within the FIFO memory, the write pointer is incremented to point to the next available memory address. When the last memory address of the FIFO memory is written, the write pointer resets or is cycled back to the first memory address in the FIFO memory. Similarly, when the FIFO memory is initially empty, a corresponding read pointer is set to zero. Data is stored in the FIFO memory via the write pointer, and the data is subsequently loaded from the FIFO memory via the read pointer. As data is loaded from the memory addresses within the FIFO memory, the read pointer is incremented to point to the next memory address with stored data. When the last memory address of the FIFO memory is read, the read pointer resets or is cycled back to the first memory address in the FIFO memory.

As data is stored in the FIFO memory and later loaded from the FIFO memory, an empty condition is indicated when the read pointer and write pointer are equal, thereby pointing to the same buffer address on the same access cycle of the FIFO memory. Similarly, a full condition is indicated when the read pointer and write pointer are equal, thereby pointing to the same buffer address, but with the write pointer one access cycle ahead of the read pointer.

An ECC system may generate ECC codes based on both the data stored in the FIFO memory as well as the write/read pointer. However, because the pattern of the write pointer and read pointer is regular and predictable, the write/read pointer does not need to be stored in memory. Instead, the write pointer may be generated and the read pointer may be regenerated in a manner similar to the techniques described in conjunction with the ECC system 300 of FIGS. 4-6.

In addition, the ECC codes may be further based on a sequence number that sequences over a number of cycles or passes through the FIFO memory. The sequence number starts from 0, increments through a number of values, and then resets or is cycled back to 0. As an example, a four-bit FIFO memory pointer could be employed for a FIFO memory that includes eight entries. The three least significant bits of the FIFO memory pointer could represent the read pointer buffer address or write pointer buffer address. The most significant bit of the FIFO memory pointer would indicate whether the FIFO memory pointer corresponds to an odd pass (or cycle) of the FIFO memory buffer or an even pass (or cycle) of the FIFO memory buffer. For example, if the FIFO memory read pointer RDPTR[3:0]=1101 and the FIFO memory write pointer WRPTR[3:0]=0101, then the read pointer buffer address and the write pointer buffer address are equal with a value of 101. However, the FIFO memory read pointer indicates an odd pass while the FIFO memory write pointer indicates an even pass. Such a condition, where the read pointer buffer address and the write pointer buffer address are equal, but the read pointer and the write pointer are on different passes, indicates a FIFO full condition, because the write pointer is ahead of the read pointer by eight entries. By contrast, if the FIFO memory read pointer RDPTR[3:0]=0101 and the FIFO memory write pointer WRPTR[3:0]=0101, then the read pointer buffer address and the write pointer buffer address are equal and the read pointer and the write pointer are both on an even pass. Such a condition, where the read pointer buffer address and the write pointer buffer address are equal, and the read pointer and the write pointer are on the same pass, indicates a FIFO empty condition, because the read pointer has caught up with the write pointer. In addition, in some embodiments, the number of data entries in the FIFO memory may not be a power of 2. In such embodiments, the write pointer and the read pointer do not loop back to 0 from the maximum value of the write pointer and the read pointer. Instead, the write pointer and the read pointer loop back to 0 after reaching a value representing the last data entry in the FIFO memory.

Additionally or alternatively, the ECC system may generate ECC codes for a FIFO memory based on any technically feasible addressing and/or encoding techniques. In some embodiments, the FIFO memory may be asynchronous. In such embodiments, the read pointer buffer address and the write pointer buffer address may follow a Gray coding scheme. With a Gray coding scheme, only one bit of the pointer address changes value between adjacent addresses as the FIFO memory cycles through the pointer addresses. Certain Gray coding schemes may not include a value of zero for the read pointer buffer address and the write pointer buffer address. In some examples, the FIFO memory cycles through n=3 FIFO addresses FIFO (addresses 0, 1, and 2), using an n=3 bit cyclical encoding. The addresses in such examples progress as shown in Table 1 below:

TABLE 1

Example FIFO Memory Address Gray Coding Scheme

| Pass | First logical pointer address and (bit pattern) | | Second logical pointer address and (bit pattern) | | Third logical pointer address and (bit pattern) | |
|---|---|---|---|---|---|---|
| Pass 1: | | | | | | |
| Initial Even Pass | 0 | (001) | 1 | (011) | 2 | (111) |
| Pass 2: | | | | | | |
| Odd Pass | 0 | (110) | 1 | (100) | 2 | (000) |
| Pass 3: | | | | | | |
| Even Pass | 0 | (001) | 1 | (011) | 2 | (111) |
| Pass 4: | | | | | | |
| Odd Pass | 0 | (110) | 1 | (100) | 2 | (000) |
| . . . | , , , | | . . . | | . . . | . . . |

In some embodiments, an empty condition may be determined when the read pointer address and the write pointer address are equal to one another. In such embodiments, a full condition may be determined when the read pointer address and the write pointer address are equal to values that are bit complements of one another, such as when one pointer address is 001, 011, 111, 110, 100, or 000 and when the other pointer address is 110, 100, 000, 001, 011, or 111, respectively. An even pass is indicated if the least significant bit (LSB) of the pointer address is set to 1, whereas an odd pass is indicated if the LSB of the pointer address is set to 0. Such techniques may be advantageous to employ in small FIFO memories, which typically exhibit very high speed. In general, these addressing techniques determine a next value of a pointer address by shifting in the complement of the most significant bit into the least significant bit. A change from an odd address to an even address, and/or vice versa, may occur when all bits Included in the pointer address are the same (e.g., 000 or 111).

In some embodiments, one or both of the read pointer address and the write pointer address may employ other encoding techniques including cyclical encoding, unary encoding, ring counters, Johnson-style counters and/or the like. In general, the disclosed techniques are applicable with any approaches that preserve a Hamming distance of 1 between adjacent pointer codes and upon cycling back from the last pointer address to the first pointer address. As used herein, a Hamming distance between two bit addresses is a value that indicates the number of positions in the two bit addresses at which the bit value is different.

FIG. 6 is a state diagram 600 for the line buffer memory 330 of the ECC system 300 of FIG. 3, according to various embodiments. The state diagram 600 illustrates the sequencing of operations for the ECC computations. The state diagram 600 processes an N×N pixel area, or kernel, for an image processing operation performed on a center pixel in the kernel. In one example, the N×N kernel is a 21 pixel by 21 pixel area. The state diagram 600 begins in the IDLE state 610, which is considered the reset state. When the ECC system 300 receives a frame initialization marker 630, indicating a start of the image processing operation, the state diagram 600 transitions from the IDLE state 610 to the SPOOL state 612.

In the SPOOL state 612, the ECC system 300 buffers at least the first (N−1)/2 memory lines. For an N×N=21×21 kernel, the ECC system 300 buffers at least the first (21−1)/2=10 memory lines. If the image processing operation preserves overfetch of the top lines, then the ECC system 300 buffers the first (N−1)/2 memory lines during the SPOOL state 612. If, on the other hand, the image processing operation removes, and does not preserve, overfetch of the top lines, then the ECC system 300 buffers the first (N−1) memory lines during the SPOOL state 612. In such cases, for an N×N=21×21 kernel, the ECC system 300 buffers at least the first (21−1)=20 memory lines. During the SPOOL state 612, the ECC system 300 buffers memory lines but does not transmit pixels. Once the first lines have been buffered 632 (either (N−1)/2 memory lines or (N−1) memory lines), the state diagram 600 transitions from the SPOOL state 612 to the TRANSFER state 614.

In the TRANSFER state 614, while the ECC system 300 receives additional memory lines, the ECC system reads and transmits pixels as the image processing operation progresses. The TRANSFER state 614 begins after (N−1)/2 memory lines if top overfetch is preserved or after (N−1) memory lines if top overfetch is removed. The TRANSFER state 614 completes (N−1)/2 memory lines before the end of the tile on the output of the line buffer memory 330. For an N×N=21×21 kernel, the TRANSFER state 614 completes (N−1)/2=10 memory lines before the end of the tile.

When the last pixel of the last memory line is received on the non-delayed input, there are still (N−1)/2=10 lines remaining in the line buffer memory 330 due to the accumulation during the SPOOL state 612. This condition results from the lag of (N−1)/2=10 lines between line buffer memory 330 input and output. If the remaining memory lines are bottom overfetch (e.g., the last row of tiles), and overfetch is not preserved 638, then these memory lines are not transmitted as center pixels of a kernel. In such cases, the state diagram 600 transitions from the TRANSFER state 614 to the end of tile (EOT) state 618. If the remaining memory lines are not bottom overfetch (e.g., the last row of tiles) or overfetch is preserved 634, then the state diagram 600 transitions from the TRANSFER state 614 to the DRAIN state 616.

In the DRAIN state 616, the ECC machine transmits the data on the remaining (N−1)/2=10 lines of the tile as center pixels of a kernel. During the DRAIN state 616 the last (N−1)/2=10 memory lines of the tile are transmitted as center pixels and additional input data is not accepted. The DRAIN state 616 completes when the last pixel of the last line has been detected on the output pixels. Since all input data is blocked, the termination packet ending the image processing operation is also blocked for the duration of the DRAIN state 616. After the last lines are drained 636, the state diagram 600 transitions from the DRAIN state 616 to the EOT state 618.

The state machine 600 enters the EOT state 618 from either the TRANSFER state 614 or the DRAIN state 616, depending on whether bottom overfetch is preserved or if the ECC system 300 has processed the last row of a tile. If the state machine 600 enters the EOT state 618 from the TRANSFER state 614, then overfetch is not preserved, and the cue for termination is the last pixel last line on input pixels. If the state machine 600 enters the EOT state 618 from the DRAIN state 616, then overfetch is preserved, and the cue for termination is the last pixel last line on output pixels. In either case, when the ECC system detects the termination of the operation 640, the state diagram 600 transitions from the EOT state 618 to the FLUSH state 620.

Figure 7:
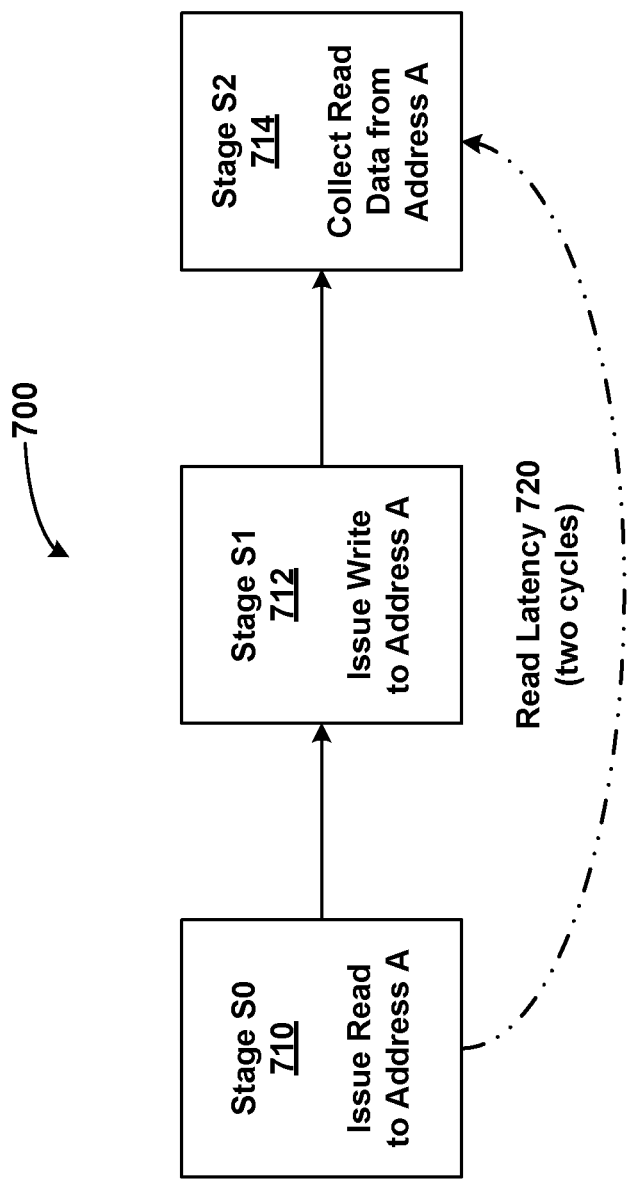
FIG. 7 is a diagram of the memory access pipeline for the line buffer memory of the ECC system of FIG. 3, according to various embodiments.

During the FLUSH state 620, the ECC system flushes any reads or writes that remain in the memory access pipeline described in conjunction with FIG. 7. When the memory access pipeline is flushed 642, the state machine 600 returns to the IDLE state 610.

FIG. 7 is a diagram of the memory access pipeline 700 for the line buffer memory 330 of the ECC system 300 of FIG. 3, according to various embodiments. In various embodiments, RAM load operations have a read latency 720 of two cycles. Consequently, the memory access pipeline 700 includes three stages. A first stage S0 710 issues a read to a particular memory address A. A second stage S1 712 and a third stage S2 714 gather the result of the read of memory address A. RAM store operations, on the other hand, complete on the same cycle the RAM store operations are issued. During the TRANSFER state 614, the read and write address are directed towards the same memory address A in the circular buffer, except that the write is directed towards a line that is exactly 21 lines apart from the read.

The read of memory address A is performed on the most recent memory line in stage S0 710 and passed through stage S1 712 and stage S2 714, while the write to memory address A is performed in stage S1 712. As a result, the old data in the memory line at memory address A is read in stage 0, prior to writing new data to the same memory address A in stage S1 712. The old data is passed through the memory access pipeline 700 as the "hot line" because that memory line is no longer in the line buffer memory 330 after stage S1 712. After a read latency 720 of two cycles, the hot line data from the read is collected. The interleaving of the read and write to the same address in the memory access pipeline 700 is what allows for the saving of a single line in the buffer. Therefore, a line buffer memory 330 that includes 20 memory lines 332 effectively functions as a line buffer memory 330 that includes 21 memory lines 332, 20 lines in the line buffer memory 330 plus the hot line flowing through the memory access pipeline 700.

Figure 8:
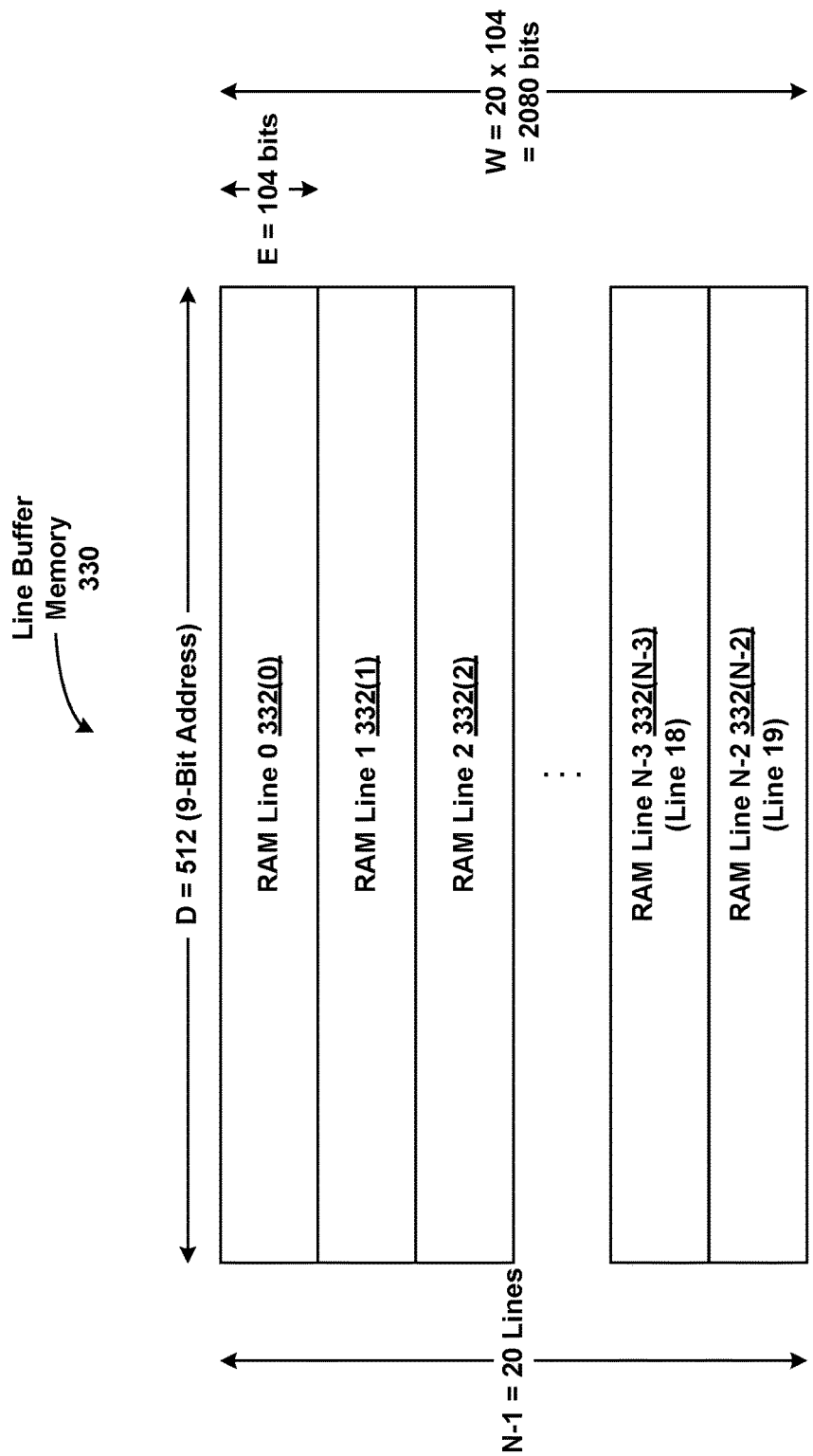
FIG. 8 is a diagram of the organization of the line buffer memory included in the ECC system of FIG. 3, according to various embodiments.

FIG. 8 is a diagram of the organization of the line buffer memory 330 included in the ECC system 300 of FIG. 3, according to various embodiments. As shown, the line buffer memory 330 includes memory lines 332(0), 332(1), 332(2), . . . 332(N−3), 332(N−2), also referred to herein as RAM lines 332. The total number of lines N includes N−1 lines in the line buffer memory 330, plus the hot line, as described herein. Therefore, a N×N=21×21 pixel kernel includes N−1=20 memory lines 332 (numbered from 0 to 19) plus a hot line for a total of 21 memory lines. Each memory line 332 stores 512 pixel pairs for total of 1024 pixels. Each pixel pair includes 96 bits, 48 bits for each pixel in the pixel pair. Correspondingly, the 512 pixel pairs in the memory line 332 are addressable via a D=9-bit address. Each memory line stores the pixel pair of 96 bits plus the ECC code of 8 bits for a total of E=104 bits. The ECC code is based on both the data bits of the pixel pair and the augmented address and sequencing information, as described herein. During a store operation, one pixel pair of 96 bits and corresponding ECC code of 8 bits is written to one memory address in one memory line 332. To prevent storing data to the other memory lines, the augmented data generator 310 generates a write enable WE 334 for each memory line 332 in the line buffer memory 330. The augmented data generator 310 asserts only the write enable 334 for the memory line 332 storing the data for the pixel pair and ECC code. During a load operation, one pixel pair of 96 bits and corresponding ECC code of 8 bits is read from each of the memory lines 332, for a total of W=(N−1)×E=20×104=2080 bits.

Figure 9:
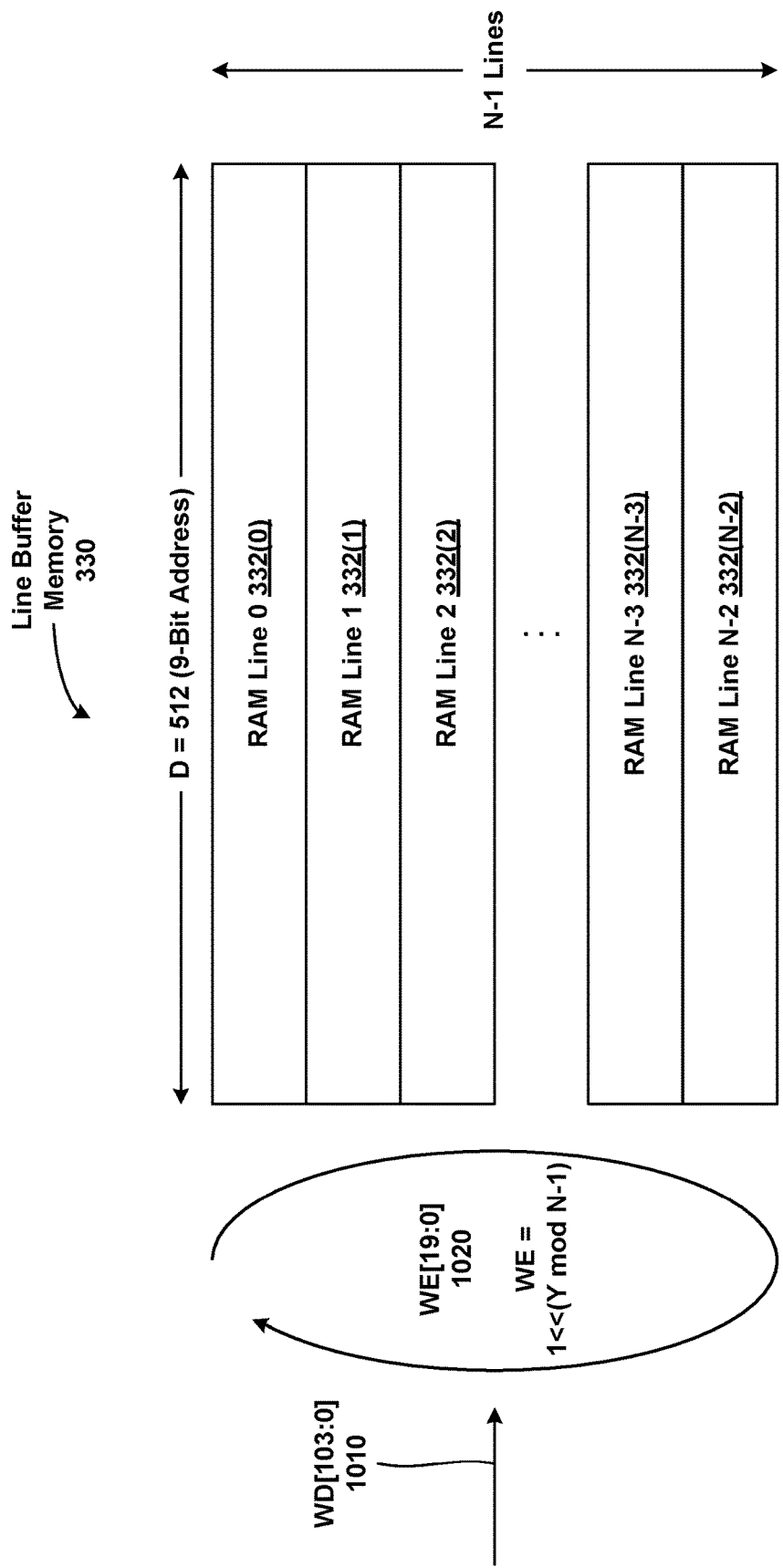
FIG. 9 is a diagram of the memory write access pattern for the line buffer memory included in the ECC system of FIG. 3, according to various embodiments.

FIG. 9 is a diagram of the memory write access pattern for the line buffer memory 330 included in the ECC system 300 of FIG. 3, according to various embodiments. In general, the write access pattern follows raster order of a tile in image frame, where each tile has a tile width of TW pixel pairs and a tile height of TH lines. In raster order, the ECC system 300 first traverses pixels along the width of the memory lines 332 by horizontally advancing the write address (X-coordinate), and then moves vertically to the next memory line 332 by advancing the Y-coordinate. Since the width of the line buffer memory 330 is greater than, or equal to, TW, the memory address is representative of the position of the pixel pair in the direction of the X-coordinate, relative to the tile. Further, TH is generally greater than the line buffer height of (N−1)=20 memory lines 332. Therefore, for every (N−1)=20 lines, the write access pattern completes a full cycle of all the memory lines 332 in the line buffer memory 330, and then starts to write over the prior data in the memory lines 332, thereby forming a circular buffer. As a result, the write access pattern is akin to a modulo (N−1) operation on the Y-coordinate to determine the write enable mask for the memory line being written for a particular store operation. The write enable mask WE[19:0] 1020 is generated according the formula WE=1<<(Y mod (N−1)).

Figure 10:
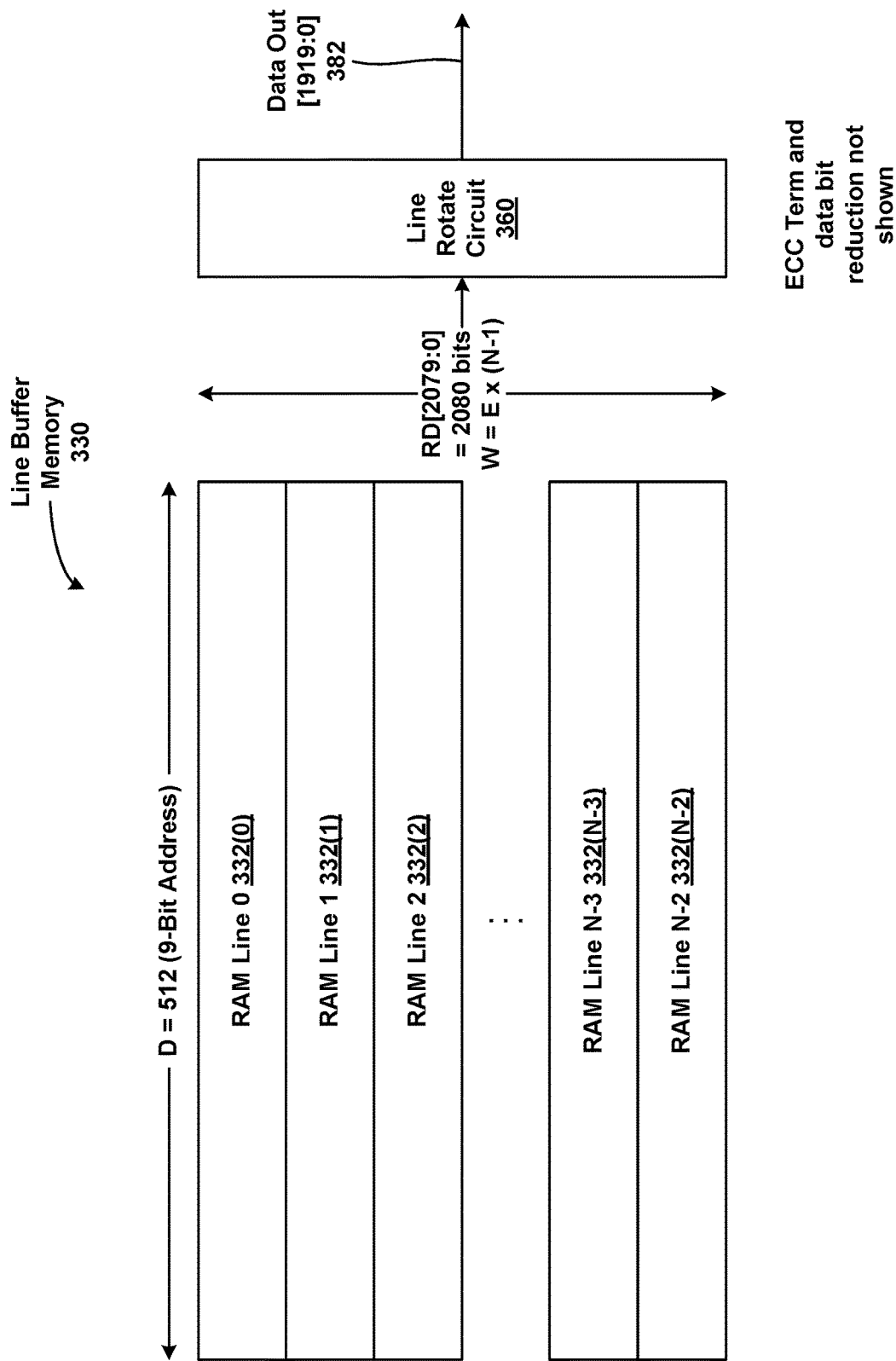
FIG. 10 is a diagram of the memory read access pattern for the line buffer memory included in the ECC system of FIG. 3, according to various embodiments.

FIG. 10 is a diagram of the memory read access pattern for the line buffer memory 330 included in the ECC system 300 of FIG. 3, according to various embodiments. In general, unlike the write access pattern that writes data for one pixel pair at a time, the read access pattern reads data along the entire width of the line buffer memory 330, one pixel pair for each memory line 332. The read access pattern reads all memory lines 332 concurrently without any read masking except for the valid bits to identify non-existing image lines at on the top and bottom edges of the image tile that have do not hold valid data. The outgoing read data RD is a column of N−1=20 pixel pairs of W=E×(N−1) 104×20=2080 bits. The read address RA[8:0] is the outgoing X-coordinate of the column of memory lines 332 being read. To form a column of pixels representing the raster order with the pixel pairs in the prior position, the outgoing data is rotated by the line rotate circuit 360 to reflect the order of the data as written via the write access pattern. The rotation factor is a value from 0 to N−2=19, derived from the Y-coordinate of the center line of the column. The X-coordinate of coincident load and store operations match, and therefore RA[8:0] matches WA[8:0]. After rotating the raw data out [1919:0], the line rotate circuit 360 transmits the data out [1919:0] 382 with the current pixel in the proper position.

Figure 11:
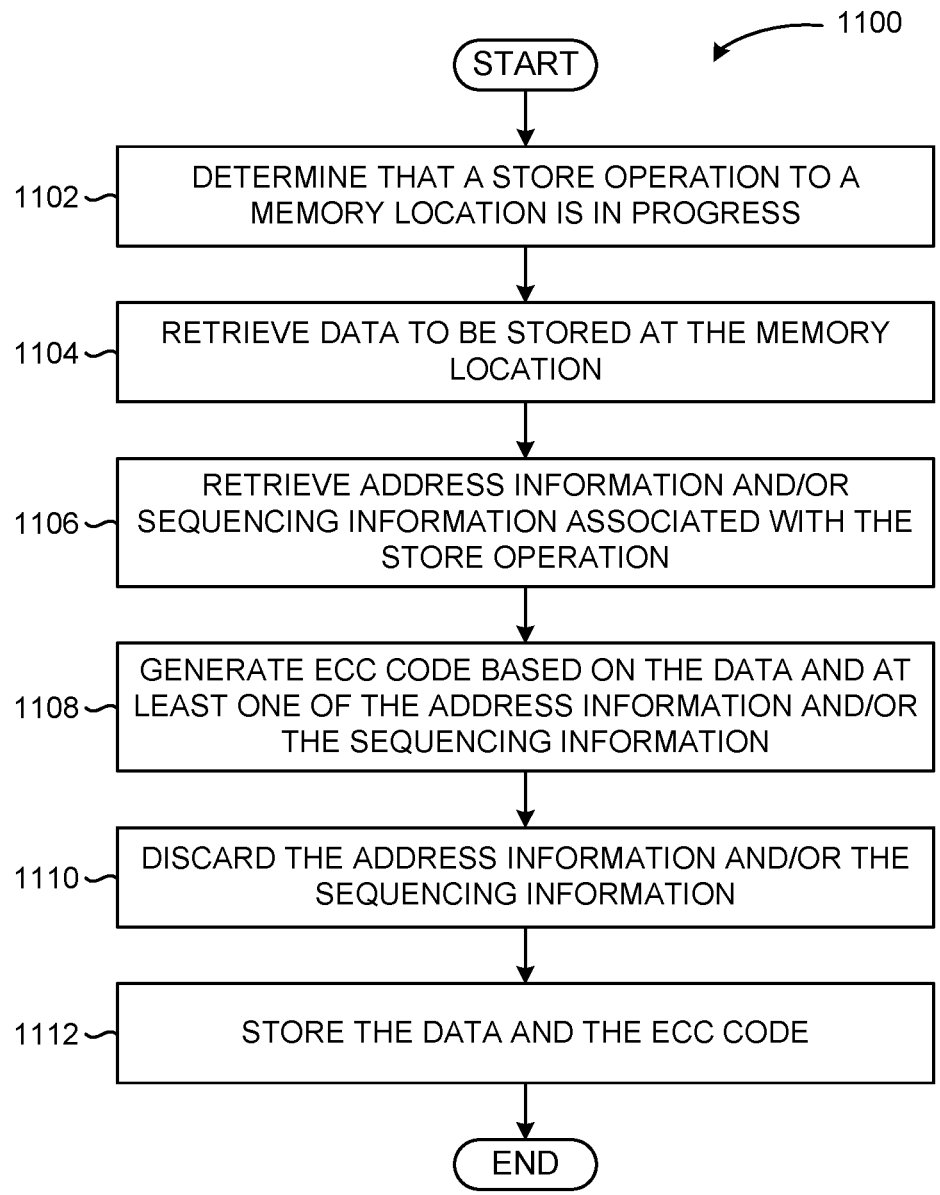
FIG. 11 is a flow diagram of method steps for generating ECC codes during store operations for the ECC system of FIG. 3, according to various embodiments.

FIG. 11 is a flow diagram of method steps for generating ECC codes during store operations for the ECC system 300 of FIG. 3, according to various embodiments. Although the method steps are described in conjunction with the systems of FIGS. 1-10, persons of ordinary skill in the art will understand that any system configured to perform the method steps, in any order, is within the scope of the present disclosure.

As shown, a method 1100 begins at step 1102, where an ECC generation circuit 320 included in an ECC system 300 determines that a store operation to a memory location is in progress. The store operation is directed towards a memory with a regular write access pattern and read access pattern, such as a line buffer memory, a FIFO memory, a read-modify-write memory, and/or the like. In some embodiments, the store operation is directed towards storing pixel data for performing image processing on an image frame.

At step 1104, ECC generation circuit 320 retrieves data to be stored at a memory location in the line buffer memory, FIFO memory, read-modify-write memory, or other memory system. In some embodiments, the store operation is for a 96-bit data word that includes data for a pair of pixels in an image. Each pixel is represented by three components of 16 bits per component. In some embodiments, the three components may include Y, U, and V components, where Y is a 16-bit luminance value and U and V are 16-bit color difference components. In some embodiments, the three components may include R, G, and B components, where R, G, and B are red, green, and blue color components, respectively.

At step 1106, the ECC generation circuit 320 retrieves address information and/or sequencing information associated with the store operation from an augmented data generator 310. The address information and/or sequencing information may include a tile number T[7:0] 308, a Y-coordinate Y[6:0] 306, and a write address WA[8:0] 304. The tile number T[7:0] 308 is an 8-bit rolling counter that cycles every 256 tiles. In image processing, an image is typically divided into rectangular tiles that are laid out in a horizontal and vertical grid. The tile number identifies which tile in the image is currently being processed. The Y-coordinate [6:0] 306 includes the 7 least significant bits of the Y-coordinate within the image that is being written in the line buffer memory 330. Additionally or alternatively, the Y-coordinate [6:0] 306 includes the 7 least significant bits of the Y-coordinate within the tile. The write address WA[8:0] 304 includes the 9 least significant bits of the address that is being written in the line buffer memory 330. Because the X-coordinate within the tile generally increments in the same steps as the write address, the least significant bits of the write address WA[8:0] 304 represents the X-coordinate within the tile that is being written in the line buffer memory 330. Additionally or alternatively, the address information and/or sequencing information may include a frame number, a write enable mask, and/or the like. Additionally or alternatively, the address information and/or sequencing information may include information related to a FIFO memory, such as a write pointer, a sequence number, and/or the like.

At step 1108, the ECC generation circuit 320 generates an ECC code based on the data to be stored at a memory location and at least one of address information and/or sequencing information associated with the store operation. The number of bits in the ECC code depends on the total number of bits being protected, including the data bits, the address information, and the sequencing information. For example, the number of error bits needed to generate a SECDEC ECC code is X=log$_2$(number of protected bits)+1, rounded up to the next higher integer. In one example, the number of protected bits is 96 data bits, 8 tile number bits, 7 Y-address bits, and 9 write address bits for a total of 96+8+7+9=120 protected bits. Therefore, the ECC code is X=log$_2$(120)+1=8 bits after rounding up. By including the 8 tile number bits, 7 Y-address bits, and 9 write address bits when generating the ECC code, the ECC code protects against errors in those additional fields. Errors in the tile number, Y-address, and/or write address may result in address decoding faults, write enable mask faults, stale data errors, and/or the like. The ECC generation circuit 320 protects against these types of errors in addition to data bit errors. In various embodiments, the ECC code may include any technically feasible number of bits, depending on the number of detectible error bits, the number of correctable error bits, and the encoding scheme for the ECC codes.

At step 1110, the ECC generation circuit 320 discards data representing address information and/or sequencing information. For example, the ECC generation circuit 320 discards the tile number T[7:0] 308, the Y-coordinate Y[6:0] 306, and the write address WA[8:0] 304. Although the ECC generation circuit 320 generates the ECC code based on this address information and/or sequencing information, the address information and/or sequencing information is regular and predictable. Therefore, the address information and/or sequencing information may be regenerated during subsequent load operations without storing the address information and/or sequencing information in memory.

At step 1112, the ECC generation circuit 320 stores the data along with the ECC code in the line buffer memory, FIFO memory, read-modify-write memory, or other memory system. When the data and the ECC code are subsequently read during a load operation, the ECC code stored in memory is verified by regenerating the address information and/or sequence information. A new ECC code is generated based on the data and the regenerated address information and/or sequence information. If the ECC code stored in memory is not equal to the new ECC code, then a memory error has occurred. Because the ECC code is based on address information and/or sequence information, various errors may be detected in addition to data errors. Such errors include write address decoding errors, read address decoding errors, write enable errors, stale data errors, and/or the like. After storing the data and the ECC code, the method 1100 then terminates.

Figure 12A:
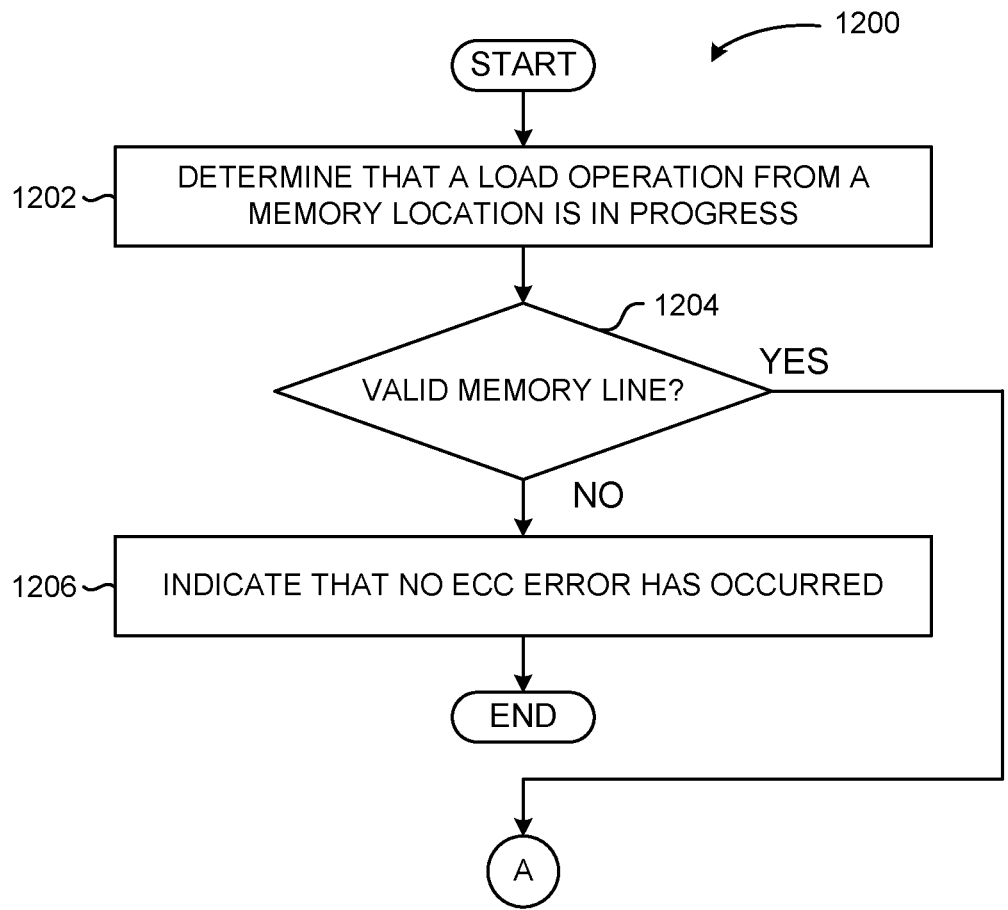
FIGS. 12A-12B set forth a flow diagram of method steps for generating and verifying ECC codes during load operations for the ECC system of FIG. 3, according to various embodiments.
Figure 12B:
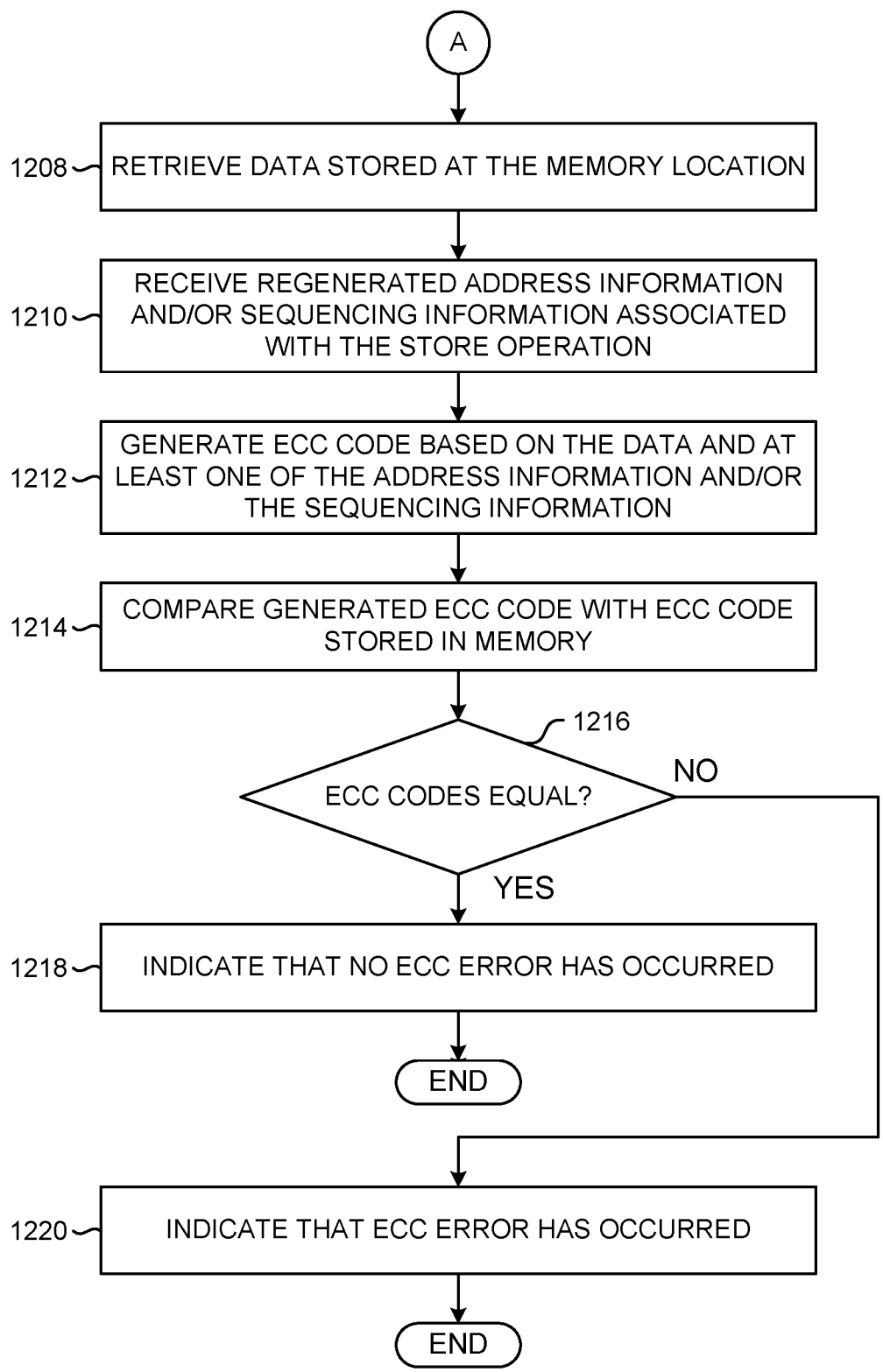

FIGS. 12A-12B set forth a flow diagram of method steps for generating and verifying ECC codes during load operations for the ECC system 300 of FIG. 3, according to various embodiments. Although the method steps are described in conjunction with the systems of FIGS. 1-10, persons of ordinary skill in the art will understand that any system configured to perform the method steps, in any order, is within the scope of the present disclosure.

As shown, a method 1200 begins at step 1202, where an ECC termination circuit 350 included in an ECC system 300 determines that a load operation from a memory location is in progress. The load operation is directed towards a memory with a regular write access pattern and read access pattern, such as a line buffer memory, a FIFO memory, a read-modify-write memory, and/or the like. In some embodiments, the load operation is directed towards loading pixel data for performing image processing on an image frame.

At step 1204, the ECC termination circuit 350 determines whether the load operation is directed towards a valid memory line 332. During certain image processing operations, data is read from multiple memory lines 332 that represent pixels from image lines that are above the current pixel and image lines that are below the current pixel, as well as pixels from the same image line as the current pixel. For example, when processing a 21×21 pixel area, data is read from 10 image lines above the current pixel and 10 image lines below the pixel, as well as data from the image line that includes the current pixel. As shown, pixel data and ECC codes are read from all 20 memory lines 332 concurrently and transmitted to respective ECC termination circuits 350.

However, when processing pixels at the top of the image, there may be fewer than 10 image lines above the current pixel. Similarly, when processing pixels at the bottom of the image, there may be less than 10 image lines below the current pixel. If the valid bit is set for the memory line 332 targeted by the current load operation, then the data stored in the corresponding memory line 332 includes image data from an actual image line. If the valid bit is not set for the memory line 332 targeted by the current load operation, then the data stored in that memory line 332 may be random or stale, because the memory line 332 is either above the first line of the image or below the last line of the image.

If the load operation is directed towards a non-valid memory line 332, then the method proceeds to step 1206, where the ECC termination circuit 350 indicates that no ECC error has occurred. The ECC termination circuit 350 thereby is prevented from generating spurious errors due to uninitialized memory. As a result, the ECC system 300 eliminates the need for an initialization pass to write good data into memory at the time of bootup or system power up. The method 1200 then terminates.

If, at step 1204, the load operation is directed towards a valid memory line 332, then the method proceeds to step 1208, where the ECC termination circuit 350 retrieves the data stored at the memory location. Additionally, or alternatively, the ECC termination circuit 350 retrieves the data stored at a corresponding memory location in a different memory line 332. The corresponding memory location may be in a memory line 332 that is different from the memory line 332 of the load operation, and at the same relative position within the memory line 332.

The ECC termination circuit 350 retrieves data stored at the memory location in the line buffer memory, FIFO memory, read-modify-write memory, or other memory system. In some embodiments, the load operation is for a 96-bit data word that includes data for a pair of pixels in an image. Each pixel is represented by three components of 16 bits per component. In some embodiments, the three components may include Y, U, and V components, where Y is a 16-bit luminance value and U and V are 16-bit color difference components. In some embodiments, the three components may include R, G, and B components, where R, G, and B are red, green, and blue color components, respectively.

At step 1210, the ECC termination circuit 350 receives regenerated the address information and/or the sequencing information from an augmented data regenerator 340. The address information and/or sequencing information may include a tile number T[7:0] 308, a Y-coordinate Y[6:0] 306, and a write address WA[8:0] 304. The tile number T[7:0] 308 is an 8-bit rolling counter that cycles every 256 tiles. In image processing, an image is typically divided into rectangular tiles that are laid out in a horizontal and vertical grid. The tile number identifies which tile in the image is currently being processed. The Y-coordinate [6:0] 306 includes the 7 least significant bits of the Y-coordinate within the image that is being written in the line buffer memory 330. Additionally or alternatively, the Y-coordinate [6:0] 306 includes the 7 least significant bits of the Y-coordinate within the tile. The write address WA[8:0] 304 includes the 9 least significant bits of the address that is being written in the line buffer memory 330. Because the X-coordinate within the tile generally increments in the same steps as the write address, the least significant bits of the write address WA[8:0] 304 represents the X-coordinate within the tile that is being written in the line buffer memory 330. Additionally or alternatively, the address information and/or sequencing information may include a frame number, a write enable mask, and/or the like. Additionally or alternatively, the address information and/or sequencing information may include information related to a FIFO memory, such as a write pointer, a sequence number, and/or the like.

At step 1212, the ECC termination circuit 350 generates an ECC code based on the data stored at a memory location and at least one of the regenerated address information and/or sequencing information associated with the load operation. The number of bits in the ECC code depends on the total number of bits being protected, including the data bits, the address information, and the sequencing information. For example, the number of error bits needed to generate a SECDEC ECC code is $X=\log_2$(number of protected bits)+1, rounded up to the next higher integer. In one example, the number of protected bits is 96 data bits, 8 tile number bits, 7 Y-address bits, and 9 write address bits for a total of 96+8+7+9=120 protected bits. Therefore, the ECC code is $X=\log_2(120)+1=8$ bits after rounding up. By including the 8 tile number bits, 7 Y-address bits, and 9 write address bits when generating the ECC code, the ECC code protects against errors in those additional fields. Errors in the tile number, Y-address, and/or write address may result in address decoding faults, write enable mask faults, stale data errors, and/or the like. The ECC termination circuit 350 protects against these types of errors in addition to data bit errors. In various embodiments, the ECC code may include any technically feasible number of bits, depending on the number of detectible error bits, the number of correctable error bits, and the encoding scheme for the ECC codes.

At step 1214, the ECC termination circuit 350 compares the ECC code generated in step 1212 with the ECC code stored in memory at the memory location of the load operation. At step 1216, the ECC termination circuit 350 determines whether the ECC code generated in step 1212 is equal to the ECC code stored in memory. If the ECC code generated in step 1212 is equal to the ECC code stored in memory, then the method 1200 proceeds to step 1218, where the ECC termination circuit 350 indicates that no memory error has occurred. The method 1200 then terminates.

If, at step 1216, the ECC code generated in step 1212 is not equal to the ECC code stored in memory, then the method 1200 proceeds to step 1220, where the ECC termination circuit 350 indicates that a memory error has occurred. If the memory error is a data bit error, then the ECC termination circuit 350 detects and/or corrects the error according to the capability of the ECC termination circuit 350 to detect and correct 1-bit errors, 2-bit errors, 3-bit errors, and/or the like. If the memory error is an error in the augmented addressing and sequencing information, then the error may be more serious, such as writing a data word to an incorrect memory address or failing to write data to memory. Therefore, if the memory error is an error in the augmented addressing and sequencing information, then the ECC termination circuit 350 forces a double bit error or otherwise indicates that the detected error is not correctable. If the ECC termination circuit 350 detects and corrects a single bit error, then the ECC termination circuit 350 transmits an indicator on a corresponding bit of the single bit error correction field SEC out [19:0] 384. If the ECC termination circuit 350 detects a double bit error, or otherwise forces a double bit error, then the ECC termination circuit 350 transmits an indicator on a corresponding bit of the double bit error detection field DED out [19:0] 386. The method 1200 then terminates.

In sum, various embodiments include an error correction code (ECC) system that is capable of detecting various system errors in addition to data bit errors. More specifically, the ECC system is capable of detecting write address decoding errors, read address decoding errors, write enable errors, stale data errors, and/or the like. Write address decoding errors result in data being written to an incorrect memory address during store operations. Similarly, read address decoding errors result in data being read from an incorrect memory address during load operations. Write enable failures result in one or more devices failing to write data during store operations or read data during load operations. Stale data errors occur when a successfully written memory location is subject to a subsequent write that completely fails. This leaves the memory address with the data from the first write. Traditional ECC systems are incapable of detecting these additional types of errors.

The additional errors are detected by relying on two properties. First, The ECC system disclosed herein generates ECC codes from address and sequencing information as well as from the data bits. In addition to data bits, the input to the ECC generator is augmented to include read address, write address, and write enable masks (in the case of a line buffer memory) or write pointer and read pointer (in the case of a first-in-first-out (FIFO) memory). The input to the ECC generator is further augmented to include sequencing information such as line numbers, cycling pixel tile count, and frame count ((in the case of a line buffer memory) or a sequence number (in the case of a FIFO memory). Second, certain memories, such as line buffer memories and FIFO memories, have regular, predictable write access patterns and read access patterns. In such memories, the address and sequencing information generated during store operations may be regenerated during load operations. Therefore, the address and sequencing information does not need to be stored in memory, even though the address and sequencing information is used to generate the ECC code. Instead, only the data bits and the ECC code are stored in memory. The disclosed techniques may be applied to any memory system with a regular or predictable access pattern, such as line buffer memories, FIFO memories, read-modify-write memory systems, and/or the like.

Further, certain memories, such as line buffer memories, have one store circuit and multiple load circuits. This feature allows for reading multiple memory lines, such as 20 memory lines, during load operations. The disclosed ECC system includes one ECC generation circuit on the store side of the memory and separate ECC termination circuits on the load side of the memory for each memory line. As a result, the ECC system is able to correct and/or detect multiple errors per memory load operation—one error per memory line stored in the line buffer memory. Because only one ECC generation circuit on the store side of the line buffer memory is needed to support multiple ECC termination circuits on the load side of the line buffer memory, the hardware cost in terms of die area and power consumption is approximately one-half the traditional approach that includes one ECC generation circuit and one ECC termination circuit for each memory line in the line buffer memory.

In addition, the ECC system generates a valid indicator based on tracking word masks. ECC errors are enabled for memory lines that are determined to be valid and disabled for memory lines that are determined to be invalid. Therefore, the ECC system eliminates the need for an initialization pass at the time of bootup or system power up. Should portions of uninitialized memory be read, any spurious error due to uninitialized memory is filtered by tracking word masks.

At least one technical advantage of the disclosed techniques relative to the prior art is that, with the disclosed techniques, memory errors other than data errors are detectable by the ECC system without needing additional memory to detect such errors. Therefore, address decoder errors and memory write failures are detectable, in addition to data errors, without substantially increasing cost, SoC surface area, or power consumption. Another technical advantage of the disclosed techniques relative to the prior art is that spurious memory errors associated with uninitialized memory are suppressed, alleviating the need to initialize all memory locations when a computer system is first powered up. As a result, bootup times may be reduced relative to prior ECC approaches. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for detecting errors in a memory, the method comprising:
    retrieving first data associated with a first store operation directed towards a memory address that was generated according to a memory access pattern;
    generating a first error correction code (ECC) code based on the first data and at least one of address information or sequencing information associated with the first store operation;
    storing the first data and the first ECC code at the memory address;
    in response to a load operation, reading the first data and the first ECC code from the memory address; and
    regenerating the at least one of the address information or the sequencing information associated with the first store operation based on the memory access pattern.

2. A computer-implemented method for detecting errors in a memory, the method comprising:
    retrieving first data associated with a first store operation directed towards a memory address;
    generating a first error correction code (ECC) code based on the first data and at least one of address information or sequencing information associated with the first store operation;
    storing the first data and the first ECC code at the memory address;
    retrieving the first data associated with a load operation directed towards the memory address;
    retrieving the first ECC code from the memory address;
    generating a second ECC code based on the first data and at least one of regenerated address information or regenerated sequencing information associated with the load operation;
    determining that the first ECC code is not equal to the second ECC code; and
    indicating that an ECC error associated with the load operation has occurred.

3. The computer-implemented method of claim 2, wherein the memory address is directed towards a first memory line included in a plurality of memory lines associated with a line buffer memory, and further comprising combining the first data with second data retrieved from memory lines included in the plurality of memory lines other than the first memory line to generate combined data.

4. The computer-implemented method of claim 2, wherein the ECC error comprises a write address decoding error resulting in the first data being stored to an incorrect memory address during the first store operation.

5. The computer-implemented method of claim 2, wherein the ECC error comprises a read address decoding error resulting in the first data being loaded from an incorrect memory address during the load operation.

6. The computer-implemented method of claim 2, wherein the ECC error comprises a write enable decoding error resulting in the first data failing to be stored in the memory address during the first store operation.

7. The computer-implemented method of claim 2, wherein the ECC error comprises a stale data error resulting in loading data from a second store operation that preceded the first store operation.

8. A computer-implemented method for detecting errors in a memory, the method comprising:

retrieving first data associated with a first store operation directed towards a memory address;

generating a first error correction code (ECC) code based on the first data and at least one of address information or sequencing information associated with the first store operation; and storing the first data and the first ECC code at the memory address, wherein the memory comprises a line buffer memory, and the at least one of address information or sequencing information includes at least one of a tile number, a Y-coordinate, an X-coordinate, a frame number, or a write enable mask.

9. A computer-implemented method for detecting errors in a memory, the method comprising:

retrieving first data associated with a first store operation directed towards a memory address;

generating a first error correction code (ECC) code based on the first data and at least one of address information or sequencing information associated with the first store operation; and storing the first data and the first ECC code at the memory address, wherein the memory comprises a first-in-first-out memory, and the at least one of address information or sequencing information includes at least one of a write pointer or a sequence number.

10. A computer-implemented method for detecting errors in a memory, the method comprising:

retrieving first data associated with a first store operation directed towards a memory address;

generating a first error correction code (ECC) code based on the first data and at least one of address information or sequencing information associated with the first store operation; and storing the first data and the first ECC code at the memory address, wherein the at least one of address information or sequencing information includes a stream number that identifies a source of the first data stored at the memory address.

11. One or more non-transitory computer-readable media storing program instructions that, when executed by one or more processors, cause the one or more processors to perform steps of:

retrieving first data associated with a first store operation directed towards a memory address within a memory, wherein the memory address was generated according to a memory access pattern;

generating a first error correction code (ECC) code based on the first data and at least one of address information or sequencing information associated with the first store operation;

storing the first data and the first ECC code at the memory address;

in response to a load operation, reading the first data and the first ECC code from the memory address; and regenerating the at least one of the address information or the sequencing information associated with the first store operation based on the memory access pattern.

12. One or more non-transitory computer-readable media storing program instructions that, when executed by one or more processors, cause the one or more processors to perform steps of:

retrieving first data associated with a first store operation directed towards a memory address within a memory;

generating a first error correction code (ECC) code based on the first data and at least one of address information or sequencing information associated with the first store operation;

storing the first data and the first ECC code at the memory address retrieving the first data associated with a load operation directed towards the memory address;

retrieving the first ECC code from the memory address;

generating a second ECC code based on the first data and at least one of regenerated address information or regenerated sequencing information associated with the load operation;

determining that the first ECC code is not equal to the second ECC code; and indicating that an ECC error associated with the load operation has occurred.

13. The one or more non-transitory computer-readable media of claim 12, wherein the memory address is directed towards a first memory line included in a plurality of memory lines associated with a line buffer memory, and wherein the steps further comprise combining the first data with second data retrieved from memory lines included in the plurality of memory lines other than the first memory line to generate combined data.

14. The one or more non-transitory computer-readable media of claim 12, wherein the ECC error comprises a write address decoding error resulting in the first data being stored to an incorrect memory address during the first store operation.

15. The one or more non-transitory computer-readable media of claim 12, wherein the ECC error comprises a read address decoding error resulting in the first data being loaded from an incorrect memory address during the load operation.

16. The one or more non-transitory computer-readable media of claim 12, wherein the ECC error comprises a write enable decoding error resulting in the first data failing to be stored in the memory address during the first store operation.

17. The one or more non-transitory computer-readable media of claim 12, wherein the ECC error comprises a stale data error resulting in loading data from a second store operation that preceded the first store operation.

18. One or more non-transitory computer-readable media storing program instructions that, when executed by one or more processors, cause the one or more processors to perform steps of:

retrieving first data associated with a first store operation directed towards a memory address within a memory;

generating a first error correction code (ECC) code based on the first data and at least one of address information or sequencing information associated with the first store operation; and storing the first data and the first ECC code at the memory address, wherein the memory comprises a line buffer memory, and the at least one of address information or sequencing information includes at least one of a tile number, a Y-coordinate, an X-coordinate, a frame number, or a write enable mask.

19. One or more non-transitory computer-readable media storing program instructions that, when executed by one or more processors, cause the one or more processors to perform steps of:

retrieving first data associated with a first store operation directed towards a memory address within a memory;

generating a first error correction code (ECC) code based on the first data and at least one of address information or sequencing information associated with the first store operation; and storing the first data and the first ECC code at the memory address, wherein the memory comprises a first-in-first-out memory, and the at least one of address information or sequencing information includes at least one of a write pointer or a sequence number.

20. A system, comprising:

a memory that includes storage for data and error correction code (ECC) codes;

data memory that includes a plurality of data bits; and an ECC subsystem that:

retrieves data associated with a first store operation directed towards a memory address within the memory, wherein the memory address was generated according to a memory access pattern;

generates a first ECC code based on the data and at least one of address information or sequencing information associated with the first store operation;

stores the data and the first ECC code at the memory address;

in response to a load operation, reads the data and the first ECC code from the memory address; and regenerates the at least one of the address information or the sequencing information associated with the first store operation based on the memory access pattern.

* * * * *